US009316532B2

(12) United States Patent
Mochizuki

(10) Patent No.: US 9,316,532 B2
(45) Date of Patent: Apr. 19, 2016

(54) WAVELENGTH MONITOR AND OPTICAL MODULE

(71) Applicant: Mitsubishi Electric Corporation, Chiyoda-ku (JP)

(72) Inventor: Keita Mochizuki, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 103 days.

(21) Appl. No.: 14/327,932

(22) Filed: Jul. 10, 2014

(65) Prior Publication Data

US 2015/0043000 A1 Feb. 12, 2015

(30) Foreign Application Priority Data

Aug. 9, 2013 (JP) ................................. 2013-166763

(51) Int. Cl.
*G01B 9/02* (2006.01)
*G01J 1/42* (2006.01)
(Continued)

(52) U.S. Cl.
CPC ............. *G01J 1/4257* (2013.01); *G01J 1/0414* (2013.01); *G01J 1/0488* (2013.01); *G01J 3/0286* (2013.01); *G01J 3/26* (2013.01); *G01J 1/0411* (2013.01); *H01S 5/0014* (2013.01); *H01S 5/0687* (2013.01); *H01S 5/4031* (2013.01)

(58) Field of Classification Search
CPC ..... G01J 1/4257; G01J 1/0414; G01J 1/0411; G01J 1/0488; G01J 3/0286; G01J 3/26; H01S 5/0687; H01S 5/4031; H01S 5/0014; G01D 5/35316

USPC .......................................................... 356/454
See application file for complete search history.

(56) References Cited

U.S. PATENT DOCUMENTS

| 6,915,035 | B2 | 7/2005 | Iwafuji |
| 8,395,765 | B2 | 3/2013 | Mochizuki et al. |
| 2002/0097760 | A1* | 7/2002 | May .......................... G01J 3/02 372/18 |

(Continued)

FOREIGN PATENT DOCUMENTS

| JP | 2002-185074 | 6/2002 |
| JP | 2012-129259 | 7/2012 |

OTHER PUBLICATIONS

Keita Mochizuki et al. "A Wavelength Monitor using Unequally Spaced Back-emitting Light for Tunable LD Array", Opto Electronics and Communications Conference (OECC), 2012, 2 pages.

*Primary Examiner* — Jonathan Hansen
*Assistant Examiner* — Jonathon Cook
(74) *Attorney, Agent, or Firm* — Oblon, McClelland, Maier & Neustadt, L.L.P.

(57) ABSTRACT

A wavelength monitor monitors wavelengths of laser beams emitted from a laser source and transmitted through a collimating lens. The wavelength monitor comprises an etalon that serves as an optical filter, and an optical detector. The etalon has a transmittance that is periodic with respect to a frequency, and is disposed such that a pair of collimated beams, emitted through a pair of emitting ports of the laser source and then transmitted through the collimating lens, is incident on the optical filter at symmetrically positive and negative angles. The optical detector receives the pair of collimated beams transmitted through the etalon, and detects the intensities of the pair of collimated beams.

11 Claims, 20 Drawing Sheets

(51) Int. Cl.
*G01J 3/26* (2006.01)
*G01J 3/02* (2006.01)
*G01J 1/04* (2006.01)
*H01S 5/00* (2006.01)
*H01S 5/0687* (2006.01)
*H01S 5/40* (2006.01)

(56) References Cited

U.S. PATENT DOCUMENTS

2011/0305253 A1* 12/2011 Kobayashi .......... H01S 5/02284
  372/36
2012/0147361 A1* 6/2012 Mochizuki ............ H01S 5/4025
  356/218

* cited by examiner

WAVELENGTH MONITOR AND OPTICAL MODULE

CROSS-REFERENCE TO RELATED APPLICATION

This disclosure claims the benefit of Japanese Patent Application No. 2013-166763 filed on Aug. 9, 2013, the entire disclosure of which is incorporated herein by reference.

FIELD

The present disclosure relates to a wavelength monitor and an optical module.

BACKGROUND

In recent years in the field of optical communications, optical transmission systems are designed to provide faster data transfer speeds and greater capacities. The core technology of such systems is the wavelength division multiplexing (WDM), a prevalent system that multiplexes optical signals with different wavelengths onto a single optical fiber. To operate a stable communication system using the WDM system, spare light sources are required in case of light source failure. Unfortunately, if the spare light sources are prepared for each multiplexed optical signal, the number of spare light sources increases, resulting in increased costs for maintaining these light sources. To minimize the costs, there is a growing need for tunable light sources that enable a single light source to emit laser light with different wavelengths.

Typical tunable light sources employ a system that changes the temperature of a semiconductor laser to thereby enable tuning of oscillating wavelengths. The tunable oscillating-wavelength range of the semiconductor laser in this system, determined by this system's operating-temperature range, is within about 2-3 nm. Thus, a tunable light source that includes a plurality of semiconductor lasers is often used to broaden the range of emittable wavelengths.

Furthermore, it is required that tunable light sources maintain stable optical-signal wavelengths for a long period of time. To stabilize wavelengths, the wavelength of light emitted from a semiconductor laser is monitored to control the temperature of the semiconductor laser and the like. For this reason, a light source equipped with a wavelength monitor has been developed (see Patent Literature 1: Unexamined Japanese Patent Application Kokai Publication No. 2002-185074 and Patent Literature 2: Unexamined Japanese Patent Application Kokai Publication No. 2012-129259).

Patent Literature 1 describes a wavelength monitor in which a portion of light emitted frontward from a semiconductor laser is extracted by a beam splitter or the like and then directed into an optical filter, such as an etalon, to thereby monitor wavelengths.

Patent Literature 2 describes a wavelength monitor in which light is emitted backward from semiconductor lasers that are provided with irregularly-spaced light-emitting positions, and the light is then directed into an etalon, to thereby monitor wavelengths.

Etalons, which serve as optical filters, have a transmission characteristic that is shifted toward a frequency region depending on a light-incident angle. Thus, to obtain a desired characteristic, the etalons described in Patent Literatures 1 and 2 need to be placed at a precise angular alignment, for example, such that the angular alignment deviation of the etalon is not more than 0.05°.

In particular, in the wavelength monitor of Patent Literature 2, an end semiconductor laser of the arrayed semiconductor lasers has a light-emitting position that is offset from the center axis of a lens. Consequently, a collimated beam after transmitted through the lens propagates at a tilted angle, which increases the angle of beam-incidence on the etalon. Etalons serve as optical filters whose transmittance has a periodic frequency-dependence due to interference involving multiple reflections of light that propagates inside the etalon. Thus, as the angle of beam-incidence on the etalon increases, positional changes of the interfering light in case of the occurrence of angular-variations become greater. This results in a highly-varied transmission-wavelength characteristic of the etalon.

SUMMARY

In consideration of the foregoing circumstances, the present disclosure has an objective to provide a wavelength monitor and optical module that can reduce a required angular precision for the alignment of an optical filter.

To achieve the foregoing objective, a wavelength monitor according to the present disclosure monitors wavelengths of laser beams that are emitted from a laser source and transmitted through a collimating lens. The wavelength monitor comprises an optical filter and an optical detector. The optical filter is disposed such that a pair of same-wavelength collimated beams, emitted from a pair of emitting ports of a laser source and transmitted through the collimating lens, is incident on the optical filter at symmetrically positive and negative angles. The optical filter has a transmittance that is periodic with respect to frequencies. The optical detector receives the pair of collimated beams transmitted through the optical lens, and detects the intensities of the received collimated beams.

BRIEF DESCRIPTION OF THE DRAWINGS

A more complete understanding of this application can be obtained when the following detailed description is considered in conjunction with the following drawings, in which.

DETAILED DESCRIPTION

The following explains embodiments of the present disclosure in detail with reference to the drawings.

Embodiment 1

Figure 1:
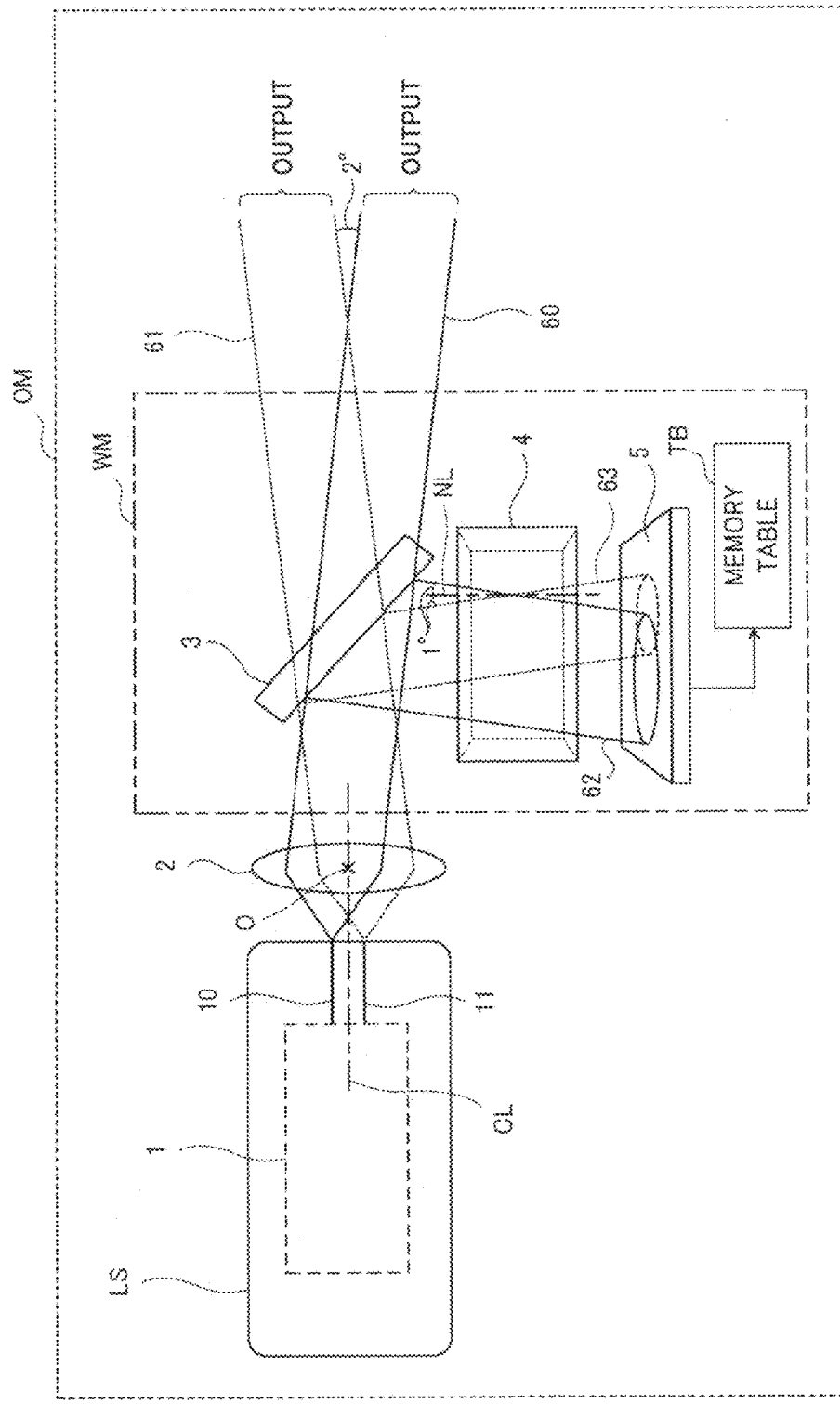
FIG. 1 is a schematic diagram of a wavelength monitor according to Embodiment 1 of the present disclosure.

As shown in FIG. 1, a tunable optical module OM according to Embodiment 1 of the present disclosure comprises a laser source LS that enables arbitrary tuning of oscillating wavelengths, a collimating lens 2 that collimates laser beams emitted from the laser source LS, and a wavelength monitor WM that monitors wavelengths of the collimated beams.

The wavelength monitor WM comprises, as shown in FIG. 1, a beam splitter 3 that splits a portion of the collimated beam, a crystal etalon 4 that serves as an optical filter on which the split light is incident, an optical detector 5 that detects the intensities of the collimated beams transmitted through the etalon 4.

The laser source LS comprises a tunable laser 1. The tunable laser 1 comprises a pair of emitting ports 10 and 11 for emitting beams having the same intensity and wavelength therethrough. FIG. 1 conceptually illustrates light beams 60 and 61 emitted through the two emitting ports 10 and 11, and light beams 62 and 63 split by the beam splitter 3. The spacing between the emitting ports 10 and 11 is set to a distance that allows the light beams 60 and 61 transmitted through the collimating lens to form an angle of 2°.

The collimating lens 2 converts divergent light beams emitted through the two emitting ports 10 and 11 into parallel light beams. The collimating lens 2 is disposed such that the center O thereof is on the center line CL between the emitting ports 10 and 11.

The beam splitter 3 is an optical device that reflects, onto the etalon 4, a portion of the collimated beam transmitted through the collimating lens 2, and allows the remaining portion of the collimated beam to travel therethrough.

The etalon 4 is a wavelength filter that has a wavelength-dependent transmittance. The etalon 4 is disposed such that the two light beams 62 and 63 having the same wavelength transmitted through the collimating lens 2 are incident on the etalon 4 at symmetrically positive and negative angles. In this example, the spacing between the emitting ports 10 and 11 is set to a distance that allows the light beams 60 and 61 to form an angle of 2°. Thus, the incident angles at which the light beams 62 and 63 are incident on the etalon are symmetric and are each 1° with respect to a normal line NL of the incident surface of the etalon 4.

The optical detector 5 is a photodiode that receives the collimated beams transmitted through the etalon 4, and detects the intensities of the received beams. The transmittance of the etalon 4 has a periodic frequency-dependence. Thus, the light intensity detected by the optical detector 5 depends on the frequency of the light emitted by the tunable laser 1. The wavelength monitor WM comprises memory such as a memory table TB that prestores a relationship between light frequencies and light intensities detected by the optical detector 5. The wavelength monitor WM uses the memory table TB to identify an optical frequency corresponding to the light intensity detected by the optical detector 5, to thereby obtain the wavelength (light speed/frequency) of the laser light emitted by the tunable laser 1. That is to say, with the optical detector 5 that detects the intensity of light, the wavelength of the light can be detected.

Figure 2:
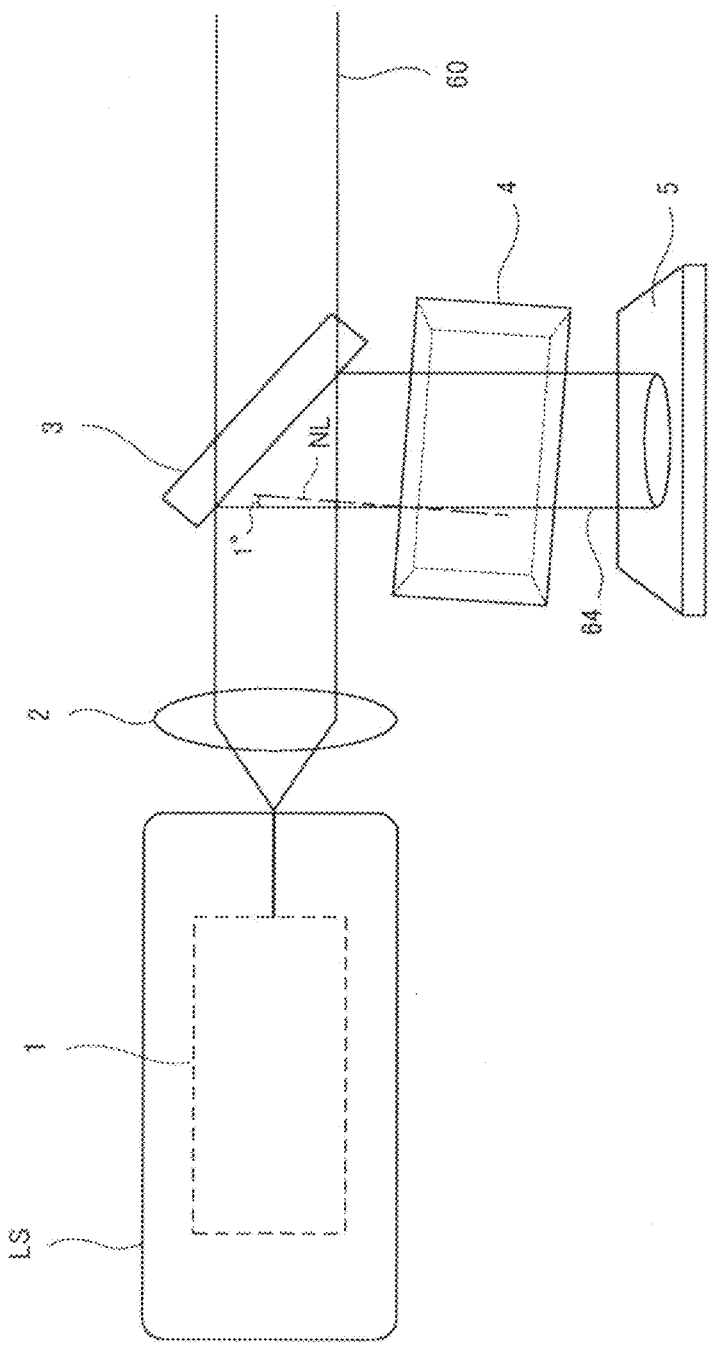
FIG. 2 is a schematic diagram of a conventional wavelength monitor.

Simulation results regarding the transmission-wavelength characteristic of Embodiment 1 are now described. For comparison purposes, explanations are first given on simulation results regarding the etalon-alignment-angle dependency of the transmission-wavelength characteristic in a conventional structure. FIG. 2 illustrates the configuration of a conventional wavelength monitor that is used in the simulation. The conventional wavelength monitor has a similar configuration as Embodiment 1, except that, in the conventional one, the tunable laser 1 is provided with a single emitting port and the etalon 4 is tilted at approximately 1° with respect to the light beam 64 that is split by the beam splitter 3.

The collimating lens 2 has a focal length of 0.7 mm, being placed 0.7 mm away from the tunable laser 1. The beam splitter 3 splits approximately 10% of the collimated beam 60 toward the optical detector 5. To prevent the light from reflecting back, the etalon 4 is tilted by approximately 1° with respect to the light beam 64 that is split by the beam splitter 3, and is placed 1.5 mm away from the beam splitter 3. In addition, the etalon 4 has a free spectrum range (FSR) of 50 GHz and a refractive index of approximately 1.52. The optical detector 5 is a photodiode having a receiving surface of a 250 nm square. The optical detector 5 is placed 1.0 mm away from the etalon 4 and disposed such that the receiving surface forms an angle of 80° to 90° with the light beam 64 transmitted through the etalon 4, so as to obtain a sufficient light-receiving efficiency.

Figure 3:
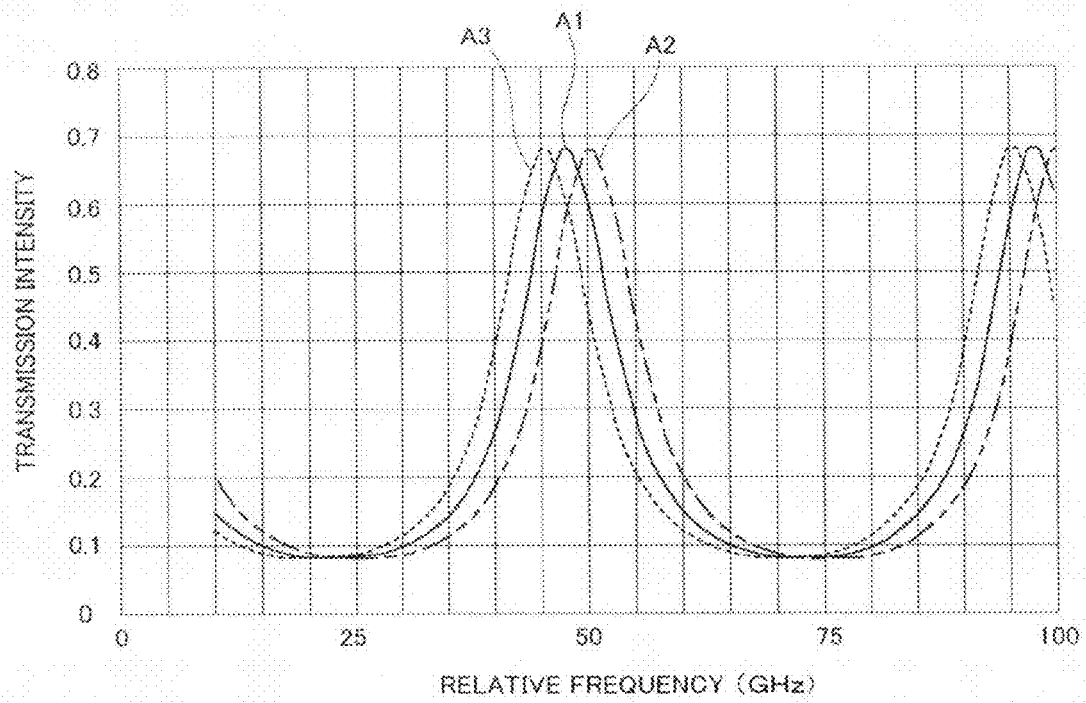
FIG. 3 is a diagram of the transmission-wavelength characteristic of a conventional wavelength monitor.

FIG. 3 illustrates the wavelength-dependency of the intensity of the light detected by the optical detector after emitted from the tunable laser 1 and then transmitted through the collimating lens 2 and the etalon 4. The curved line A1 as shown in FIG. 3 represents the transmission-wavelength characteristic where no angular alignment deviation of the etalon 4 exists. The curved line A2 represents the transmission-wavelength characteristic where the etalon 4 angularly deviates with respect to the incident light by +0.1°. The curved line A3 represents the transmission-wavelength characteristic where the etalon 4 angularly deviates with respect to the incident light by −0.1°. As indicated by the curved lines A2 and A3, the transmission-wavelength characteristic varies toward frequency regions, due to the angular alignment deviation of the etalon 4.

Figure 4:
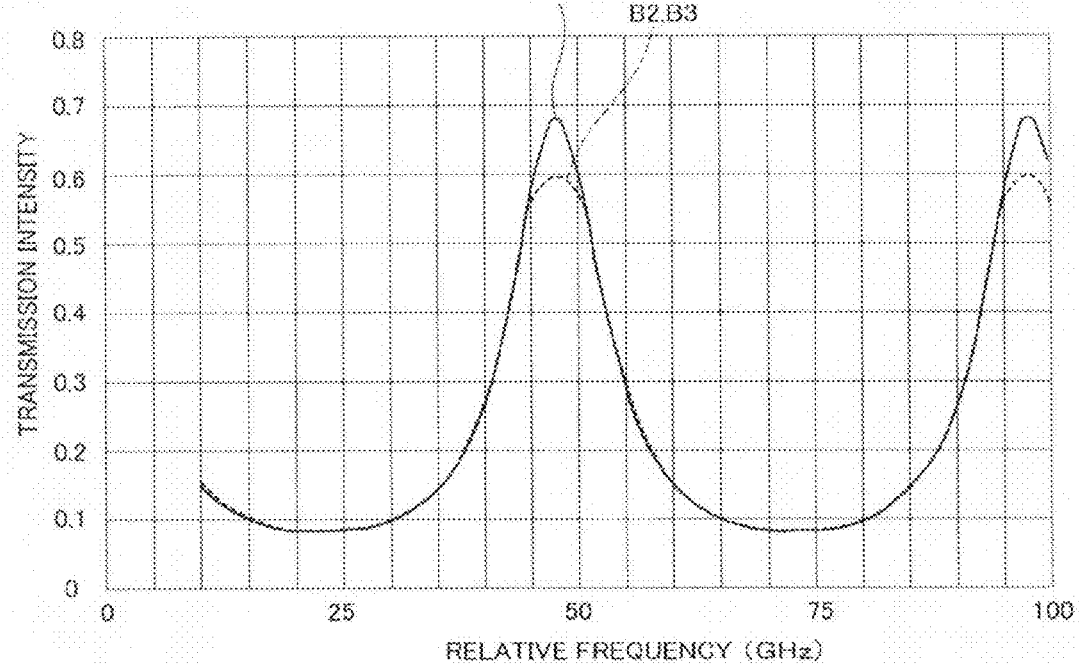
FIG. 4 is a diagram of the transmission-wavelength characteristic of a wavelength monitor according to Embodiment 1 of the present disclosure.

Simulation results regarding the transmission-wavelength characteristic of Embodiment 1 are now explained. In the wavelength monitor WM of Embodiment 1, the tunable laser 1 comprises the two emitting ports 10 and 11, and the etalon 4 is disposed such that the light beams 62 and 63 transmitted through the collimating lens are symmetrically incident on the etalon, the angles of the incidence are each 1°, as shown in FIG. 1. FIG. 4 illustrates variations in the transmission-wavelength characteristic due to the etalon-alignment angle. The curved line B1 represents the transmission-wavelength characteristic where no angular alignment deviation of the etalon 4 exists. The curved line 132 represents the transmission-wavelength characteristic where the etalon 4 angularly deviates with respect to the incident light by +0.1°. The curved line B3, which overlaps with the curved line B2, represents the transmission-wavelength characteristic where the etalon 4 angularly deviates with respect to the incident light by −0.1°. FIG. 4 indicates that, in the present embodiment, even though a peak intensity of the transmission-wavelength characteristic lowers with the angular alignment deviation of the etalon, variations toward frequency regions are suppressed. Furthermore, to precisely monitor wavelengths, the optical detector 5 observes light intensities when the transmission intensity of the etalon 4 falls within a range, for example, 0.2 to 0.5, included in the slopes but not the peaks or bottoms of the transmission characteristic B1-B3 relative to monitor frequencies.

Figure 5:
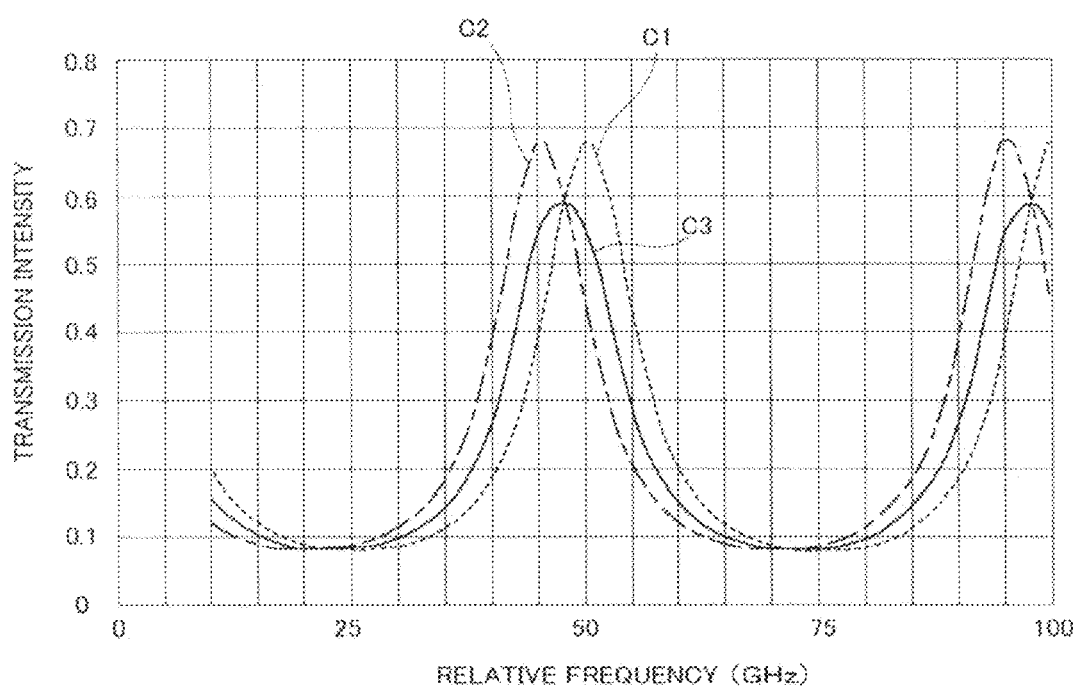
FIG. 5 is a diagram of shifts of the transmission-wavelength characteristic.

The principle thereof is now explained. In Embodiment 1, the light beams 62 and 63 are incident on the etalon 4 at symmetrically positive and negative angles. Thus, if an angular alignment deviation of the etalon 4 exists, the incident angle of one of the beams 62 and 63 is shifted in a positive direction whereas the incident angle of the other of the beams 62 and 63 is shifted in a negative direction. FIG. 5 illustrates how the transmission-wavelength characteristic shifts at this instance. In FIG. 5, the curved line C1 represents a transmission-wavelength characteristic caused by the light beam 62, the curved line C2 represents a transmission-wavelength characteristic caused by the light beam 63, and the curved line C3 represents an average between the spectra of the curved lines C1 and C2. If the angular alignment deviation of the etalon 4 is less, the curved lines C1 and C2 are shifted by almost the same extent. Thus, each shift can be offset by summing up the spectra of C1 and C2, resulting in the transmission-wavelength characteristic as represented the curved line C3; thus, there is no change in peak frequencies.

As explained above, in the wavelength monitor WM according to in Embodiment 1 of the present disclosure, the etalon 4 is disposed such that the two light beams 62 and 63 that are emitted through a pair of emitting ports 10 and 11 of the tunable laser 1 and then transmitted through the collimating lens 2 are incident on the etalon 4 at symmetrically positive and negative angles. Therefore, even if the angular alignment deviation of the etalon 4 exists, the shifted etalon transmission-wavelength characteristics are each offset, and accordingly, the etalon transmission-wavelength characteristics B2 and B3 (see FIG. 4) can be obtained whose peak frequency is equivalent to that of the etalon characteristic where no angular alignment deviation of the etalon 4 exists. The optical detector 5 uses the slopes of such curved line B2 and B3 to detect a light intensity. Thus, a required angular precision for alignment of the etalon 4 can be reduced.

The following explains other effects of Embodiment 1. In Embodiment 1 of the present disclosure, the collimating lens 2 is disposed such that the center O of the collimating lens 2 is on the center line CL between the two emitting ports 10 and 11. That is to say, the two emitting ports 10 and 11 of the tunable laser 1 are symmetric to each other with respect to the center of the collimating lens 2. The tunable laser 1 comprising the pair of symmetric emitting ports 10 and 11 is operated to actively adjust the position of the collimating lens 2. More specifically, while the optical detector 5 receives the light emitted through the emitting ports 10 and 11 from the tunable laser 1, the collimating lens 2 is reciprocated in a direction along which the emitting ports 10 and 11 are aligned, and then a real-time light beam profile is observed so as to adjust the position of the collimating lens 2 so that the center O of the collimating lens 2 is on the center line CL between the two emitting ports 10 and 11. This facilitates alignment of the collimating lens 2, i.e., adjustment of the optical axis.

Furthermore, in Embodiment 1, an angle between the light beams 60 and 61 is set to 2°. Thus, the light beams 60 and 61 are incident on the etalon 4 at an angle of ±1°, so that returning laser light that is reflected by the surface of the etalon 4 toward the tunable laser 1 can be approximately −50 dB or less. This suppresses multi-mode oscillation of the tunable laser 1 due to the returning light, thereby stabilizing the operation of the tunable laser 1.

This effect can also be obtained where the angle between the light beams 60 and 61 is set to 1.4° or greater. That is to say, the spacing between the emitting ports 10 and 11 is set to a distance that allows the light beams 60 and 61 to form an angle of 1.4° or greater, so that the angles of incidence on the etalon are ±0.7° or greater, and accordingly the returning laser light that is reflected by the surface of the etalon 4 toward the tunable laser 1 can be approximately −50 dB or less. This suppresses multi-mode oscillation of the tunable laser 1 due to the returning light, stabilizing the operation of the tunable laser 1.

Embodiment 1 describes that the intensities of the light beams emitted from the emitting ports 10 and 11 from the tunable laser 1 are the same, but they may not be precisely identical. For example, even if the intensities are in a ratio of approximately 1:1 to 1:2 or greater, similar effects can be obtained without significant deterioration as compared with the effects obtained when the intensities are identical.

Embodiment 2

A wavelength monitor WM according to Embodiment 2 of the present disclosure is now explained. In the following explanations, common elements shared with Embodiment 1 are marked with the same reference signs.

Figure 6:
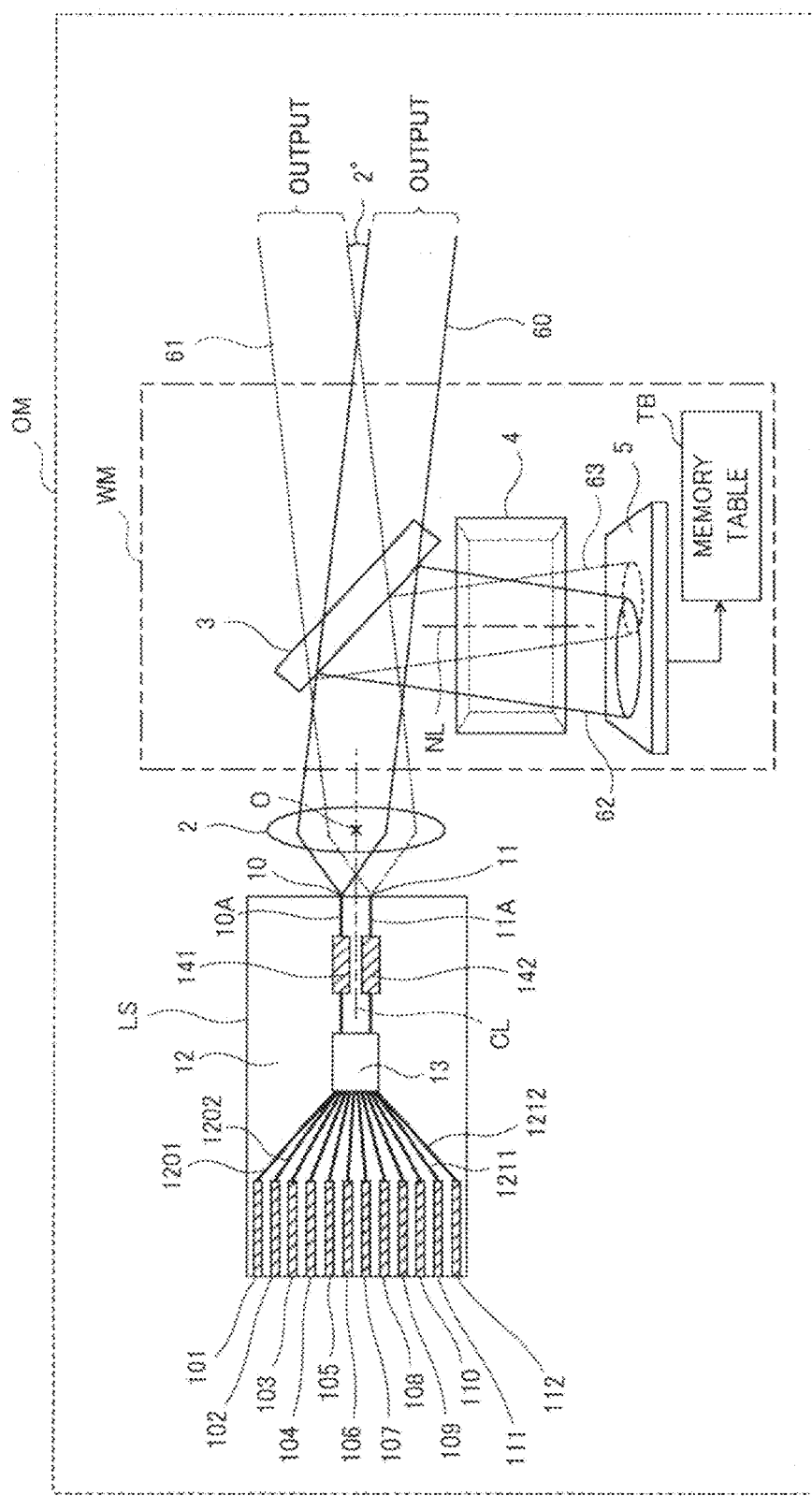
FIG. 6 is a schematic diagram of a wavelength monitor according to Embodiment 2 of the present disclosure.

The laser light source LS according to Embodiment 2 comprises, on a semiconductor substrate 12, arrayed semiconductor lasers 101-112, optical waveguides 1201-1212, an optical multi/demultiplexer 13, output waveguides 10A and 11A (emitting ports 10 and 11), and optical amplifiers 141 and 142, as shown in FIG. 6.

Twelve semiconductor lasers 101-112 are arrayed on the semiconductor substrate 12 in parallel and generate respective laser beams having different oscillating-wavelengths at the same temperature. The twelve optical waveguides 1201-1212 are optically coupled to the semiconductor lasers 101-112 and propagate the laser light emitted from the semiconductor lasers 101-102.

The optical multi/demultiplexer 13 is optically coupled to the optical waveguides 1201-1212, and combines and separates twelve input optical path into two output waveguides 10A and 11A. The optical multi/demultiplexer 13 is a 12×2 multi-mode interferometer (MMI), for example. The output waveguides 10A and 11A are optically coupled to the optical multi/demultiplexer 13 and guide the radiated two light beams to the emitting ports 10 and 11, which are located at an end portion of the semiconductor substrate 12. The optical amplifiers 141 and 142 are, for example, semiconductor optical amplifiers (SOA) that amplify the intensity of the guided light, and are provided on the output waveguides 10A and 11A.

In Embodiment 2, the spacing between the output waveguides 10A and 11A (emitting ports 10 and 11) is set to a distance that allows the light beams 60 and 61 transmitted through the collimating lens 2 to form an angle of 1.4° or greater. In addition, the collimating lens 2 is disposed such that the center O of the collimating lens 2 is on the center line CL between the output waveguides 10A and 11A. The etalon 4 is disposed such that the light beams 62 and 63 are incident on the etalon at symmetrically positive and negative angles.

As explained above, Embodiment 2 of the present disclosure describes the case where the laser source LS comprises the optical multi/demultiplexer 13 that combines and separates the twelve optical waveguides 1201-1212 into the output waveguides 10A and 11A (emitting ports 10 and 11). In this case, the etalon 4 of the wavelength monitor WM is also disposed such that the two light beams 62 and 63 transmitted through the collimating lens 2 are incident on the etalon 4 at symmetrically positive and negative angles. Therefore, even if an angular alignment deviation of the etalon 4 exists, Embodiment 2 is capable of reducing the required angular precision for the alignment of the etalon 4, similarly to Embodiment 1.

Although Embodiment 2 describes twelve semiconductor lasers 101-112, the number of semiconductor lasers may be less than twelve, for example, four or eight, or may be greater than twelve. In which case, the optical multi/demultiplexer 13 should be configured to have the same number of optical waveguides as that of the semiconductor lasers, and two output waveguides 10A and 11A.

Embodiment 3

The wavelength monitor WM of Embodiment 3 of the present disclosure is now explained. In the following explanations, common elements shared with Embodiment 2 are marked with the same reference signs.

Figure 7:
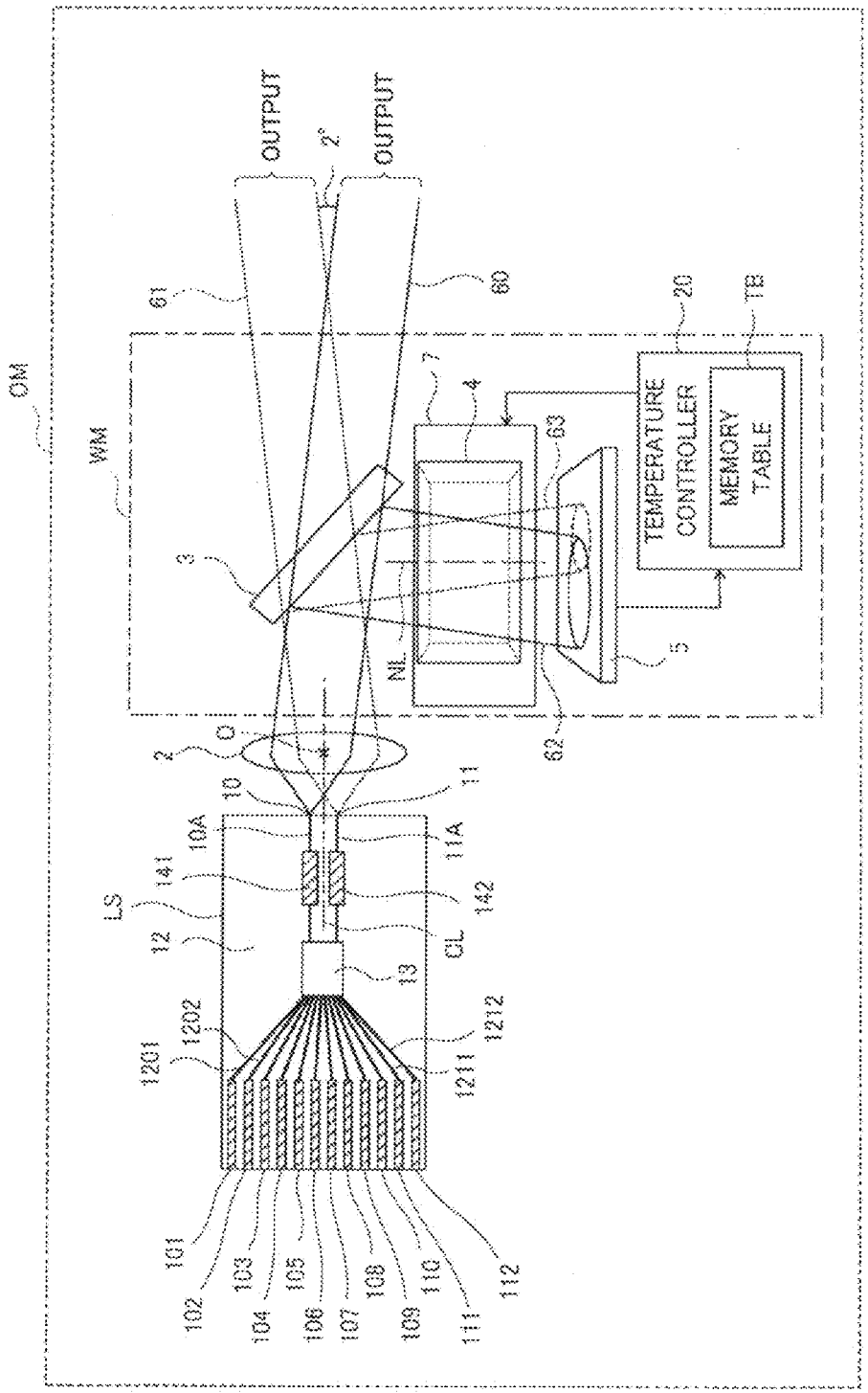
FIG. 7 is a schematic diagram of a wavelength monitor according to Embodiment 3 of the present disclosure.

The wavelength monitor WM of Embodiment 3 comprises a temperature-controllable Peltier device 7 and a temperature controller 20 that controls the Peltier device 7, as shown in FIG. 7. The etalon 4 is disposed on the Peltier device 7. The temperature controller 20 controls the Peltier device 7 based on the light intensity detected by the optical detector 5, so that the transmission-wavelength characteristics of the etalon 4 coincides with a designed value of the transmission-wavelength characteristic at the oscillating wavelength of the laser source LS.

In manufacturing the wavelength monitor WM of Embodiments 1 and 2, the transmission-wavelength characteristic might vary depending on manufacturing precision. Embodiment 3 can prevents the transmission-wavelength characteristic from deteriorating due to the manufacturing variations. The Peltier device 7 adjusts the temperature of the etalon 4 based on a controlling signal received from the temperature controller 20 to thereby match the transmission-wavelength characteristic with a reference transmission-wavelength characteristic, so that the manufacturing variations can be compensated.

More specifically, the temperature of the etalon 4 is adjusted within a range of ±20° C., so that an accepted positional deviation of the collimating lens 2 may be approximately ±2.5 µm. The temperature-adjustment range of the etalon 4 may not be limited to ±20° C.

As explained above, with a wavelength monitor WM of Embodiment 3 according to the present disclosure, the temperature of the etalon 4 by the Peltier device 7 can be controlled to compensate for manufacturing variations of the etalon 4.

Embodiment 4

A laser source LS according to Embodiment 4 is now explained. In the following explanations, common elements shared with Embodiment 3 are marked with the same reference signs.

Figure 8:
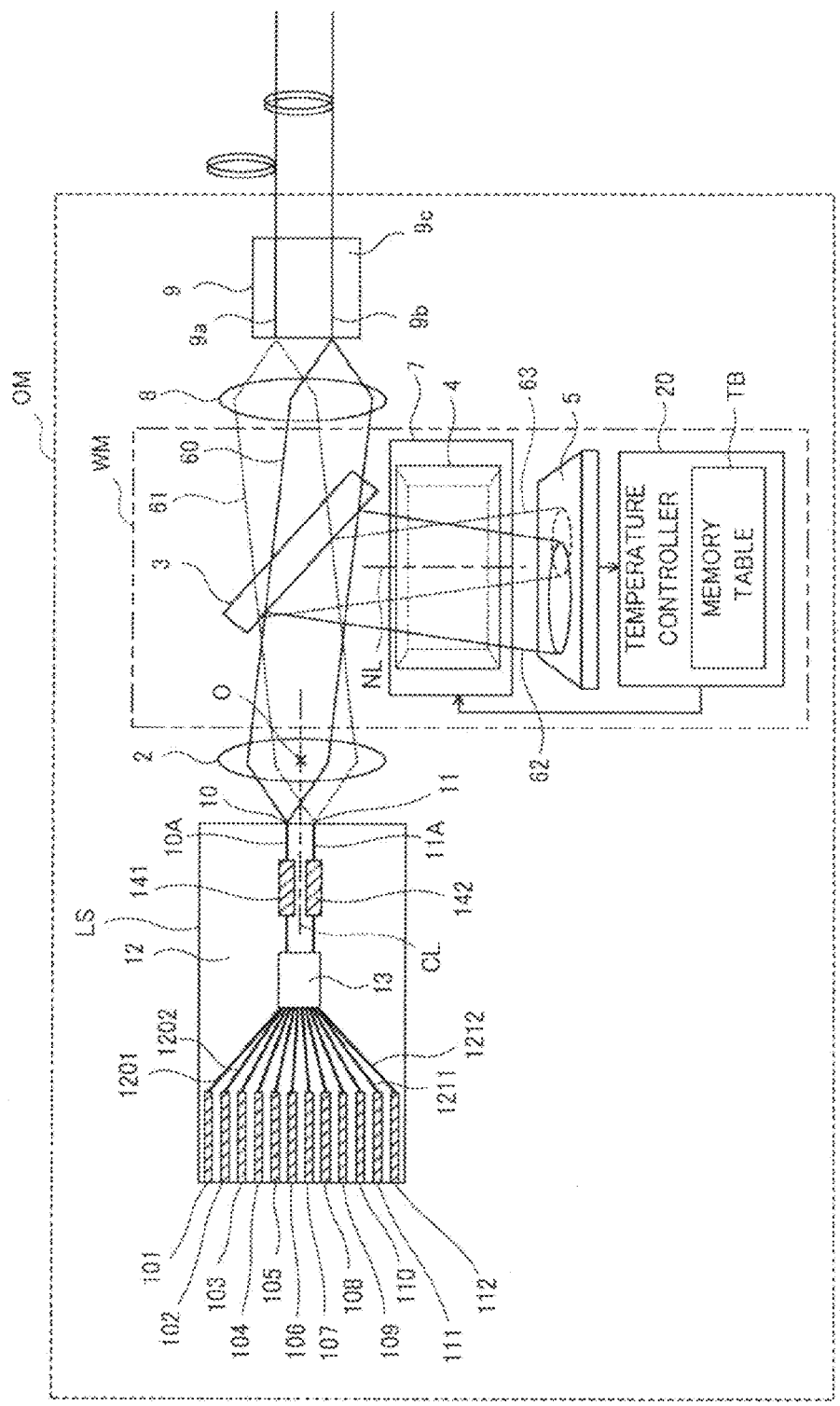
FIG. 8 is a schematic diagram of a wavelength monitor according to Embodiment 4 of the present disclosure.

A laser source LS according to Embodiment 4 comprises a collecting lens 8 and a bifurcating optical fiber 9, as shown in FIG. 8. The collecting lens 8 collects two collimated beams (parallel beams) that are transmitted through the beam splitter 3.

The bifurcating optical fiber 9 includes two cores $9a$ and $9b$, which are bundled partway by a bundler $9c$ and are then bifurcated into two. The two laser beams collected by the collecting lens 8 are incident on the two cores $9a$ and $9b$. That is to say, the cores $9a$ and $9b$ are optically coupled to the output waveguides 10A and 11A (the emitting ports 10 and 11), respectively.

For example, conventional transceivers and/or the like that use the digital coherent technology for long-distance optical communications require two optical modules, such as a signal source and a local oscillator light source. In contrast, with the laser source LS of Embodiment 4, the single optical module OM can serve these two functions, i.e., a signal source and a local oscillator light source. For example, one of the output waveguides 10A and 11A may serve as a signal light source and the other may serve as a local oscillator light source. This reduces the size of a whole system and related costs.

Embodiment 5

A wavelength-tunable optical module OM of Embodiment 5 of the present disclosure is now explained.

Figure 9:
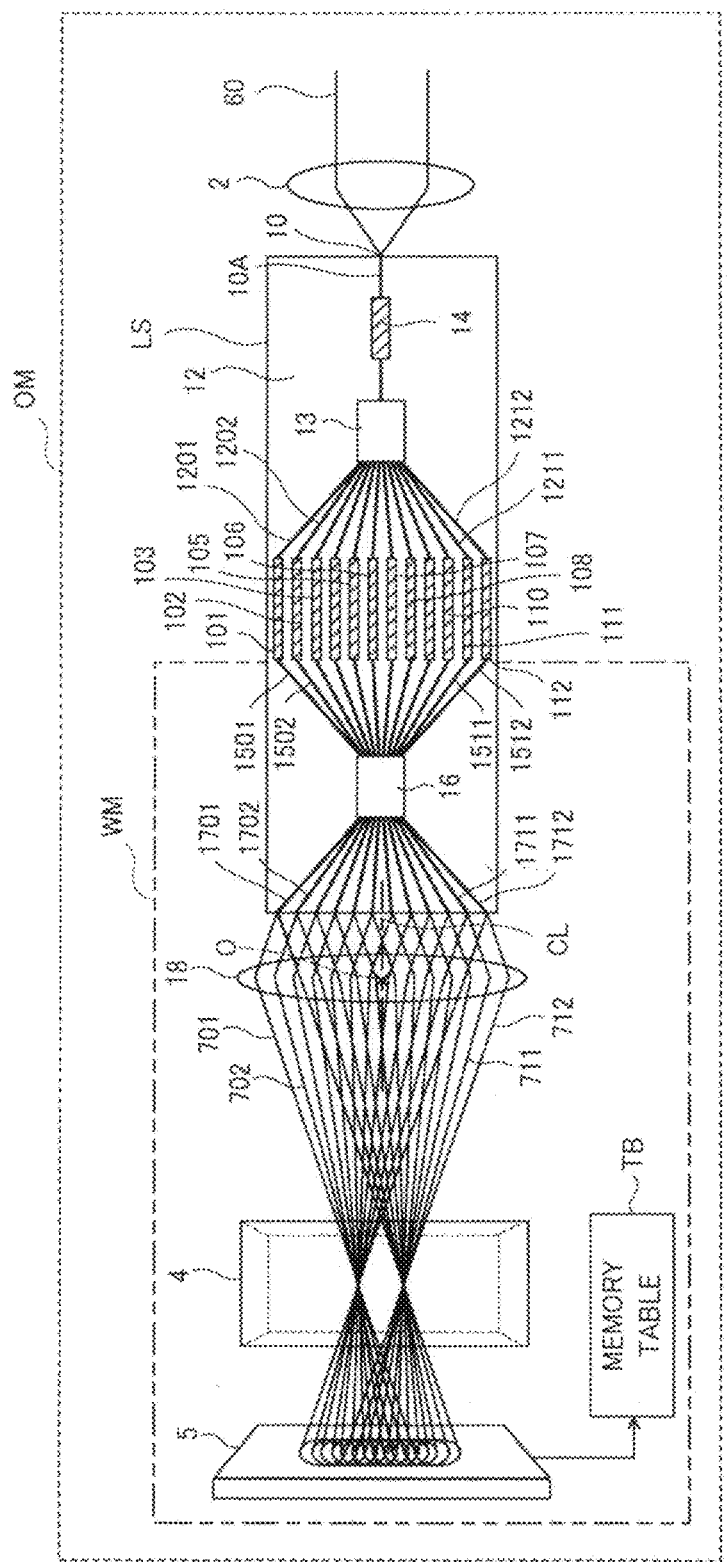
FIG. 9 is a schematic diagram of a wavelength monitor according to Embodiment 5 of the present disclosure.

The wavelength-tunable optical module OM according to Embodiment 5 comprises a laser source LS and a wavelength monitor WM, as shown in FIG. 9. The laser source LS comprises, on a semiconductor substrate 12, semiconductor lasers 101-112, optical waveguides 1201-1212, an optical multi/demultiplexer 13, an output waveguide 10A, and an optical amplifier 14.

The twelve semiconductor lasers 101-112 are arrayed in parallel on the semiconductor substrate 12 and generate respective laser beams having different oscillating-wavelengths at the same temperature. For example, a diffraction-grating cycle is determined such that the laser beams have consistent wavelengths with a wavelength grid defined by the International Telecommunication Union-Telecommunication standardization sector (ITU-T). The twelve optical waveguides 1201-1212 are optically coupled to the semiconductor lasers 101-112 and propagate the laser light emitted from the front surfaces of the semiconductor lasers 101-102.

The optical multi/demultiplexer 13 is a 12×1 multi-mode interferometer (MMI). The optical multi/demultiplexer 13 is optically coupled to the optical waveguides 1201-1212 and combines twelve input optical paths into one output waveguide 10A. The output waveguide 10A, located at a front part of the laser source LS, is optically coupled to the optical multi/demultiplexer 13 and guides the emitted light to an end portion of the semiconductor substrate 12. The optical amplifier 14, disposed on the output waveguide 10A, is a semiconductor optical amplifier (SOA), for example, that amplifies the intensity of the guided light. The divergent light beam emitted from the front-surface output waveguide 10A is converted into a parallel light beam by the collimating lens 2.

The wavelength monitor WM comprises optical waveguides 1501-1512, an optical multi/demultiplexer 16, back-side output waveguides 1701-1712 that are disposed on the semiconductor substrate 12, and a collimating lens 18, an etalon 4 and an optical detector 5.

The optical waveguides 1501-1512 are optically coupled to the semiconductor lasers 101-112 on the opposite side of the optical waveguides 1201-1212, and propagate light emitted from the back surfaces of the semiconductor lasers 101-112. The optical multi/demultiplexer 16 is a 12×12 multi-mode interferometer (MMI). The optical multi/demultiplexer 16 is optically coupled to the optical waveguides 1501-1512 and combines and separates twelve-input-optical-paths into twelve-output-optical-paths. The back-side output waveguides 1701-1712 are optically coupled to the optical multi/demultiplexer 16 and guide the twelve radiated light beams to an end portion of the semiconductor substrate 12 that is an opposite side of the output waveguide 10A.

The collimating lens 18 converts divergent light beams emitted from the back-side output waveguides 1701-1712 into parallel light beams. The etalon 4 is disposed at a backward area of the semiconductor substrate 12 and receives the incident collimated beam that is transmitted through the collimating lens 18. The etalon 4 has a frequency-dependency of a periodic transmittance. The optical detector 5 receives the light transmitted through the etalon 4 and detects the intensity of the light.

FIG. 9 conceptually illustrates the light beam 60 emitted from the output waveguide 10A and light beams 701-712 emitted from the back-side output waveguides 1701-1712.

The collimating lens 18 is disposed such that the center O of the collimating lens 18 is on the center line CL of the back-side output waveguides 1701-1712.

The etalon 4 is disposed such that an average of the incident angles of the light beams 701-712 is equal to zero degrees (emitting ports).

In the present embodiment, the etalon 4 is disposed such that the light beams 701-712 propagate or refract into the etalon 4 at an angle equal to a solution of the following equation 1, and such that twelve light beams 701-712 form six pairs of light beams, each of which is incident on the etalon at symmetrically positive and negative angles. Additionally, the back-side output waveguides 1701-1712 are irregularly-spaced such that the six pairs of light beams are each symmetric with respect to the center line CL that passes through the center of the back-side output waveguides 1706 and 1707.

Equation 1

$$\theta_k = \arccos\left(\frac{m_k c}{2n_\lambda L_{etalon} f_k}\right) \quad (1)$$

$$\left(\approx \sqrt{2\left(\frac{2n_\lambda L_{etalon} f_k}{m_k c} - 1\right)}\right)$$

Equation 2

$$f_k = f_{MON} + F \quad (2)$$

Where $\theta_k$ represents a beam propagation angle (rad) at which a laser beam emitted from the $k^{th}$ semiconductor laser propagates inside the etalon 4. The $k^{th}$ semiconductor laser refers to the $k^{th}$ light source of the semiconductor lasers 101-112 as counted from the semiconductor laser 101. The $m_k$ refers to an interference order corresponding to the $k^{th}$ semiconductor laser and is any natural number for each k value (1, 2, ... 12). The c represents light speed. The $n_\lambda$ represents the refraction index of the etalon 4 at a wavelength of $\lambda$. The $L_{etalon}$ represents the length of the etalon 4. The $f_k$ represents a frequency at which the transmittance of the etalon 4 reaches a peak. The $f_{MON}$, which represents any frequency of monitoring interest, is the wavelength grid defined by ITU-T, for example. The F represents a difference between the frequency at which the transmittance of the etalon 4 reaches a peak and an intermediate frequency at which the transmittance of the etalon 4 reaches an intermediate between a peak and a bottom. The value $f_k$ is calculated by adding F and $f_{MON}$, for each k value.

More specifically, the difference F is determined as 7.5 GHz. Thus, $f_k$ is calculated by $f_{MON}$+7.5 GHz. To precisely monitor wavelengths, the transmission characteristic of the etalon 4 at the monitor frequency should be included in the slopes of a curved line, rather than at peaks or bottoms. This is because the wavelength grid defined by ITU-T is positioned in the slopes. For this reason, in this Embodiment, any peak frequency $f_k$ and monitor frequency $f_{MON}$ are shifted by 7.5 GHz. The value indicated herein, 7.5 GHz, is a non-limiting example.

A laser beam emitted from one of the semiconductor lasers 101-112 is divided by the optical multi/demultiplexer 16 into twelve beams with the same intensity and then converted by the collimating lens 18 into parallel light beams of different propagation angles. After the collimated beams are transmitted through the etalon 4, the optical detector 5 detects the intensity of the beams. As the transmittance of the etalon 4 has a periodic frequency-dependence, the light intensity detected by the optical detector 5 depends on the frequency of the light emitted from the semiconductor lasers 101-112.

The wavelength monitor WM comprises memory such as a memory table TB that prestores a relationship between light frequencies and light intensities detected by the optical detector 5. The wavelength monitor WM uses the memory table TB to identify an optical frequency corresponding to the light intensity detected by the optical detector 5, to thereby obtain the wavelength (=light speed/frequency) of the laser beams output from the semiconductor lasers 101-112. That is to say, with the optical detector 5 that detects the intensity of light, the wavelength of the light can be detected.

If each of the propagation angles of the light beams emitted from the 1st-12th semiconductor lasers 101-112 is equal to $\theta_k$ that is calculated by the equation (1), respective transmission-wavelength characteristics of the etalon 4 for the light beams 701-712 with different propagation angles reach their peaks and bottoms at the same frequency (see FIG. 11 as described later). Hence, even in such a configuration that the sum of all of the transmission-wavelength characteristics of the etalon 4 is detected by the optical detector 5, the periodic frequency-dependence of the etalon transmittance is maintained. This enables precise wavelength monitoring.

Furthermore, the light beams 701-706 and respective light beams 707-712 are incident on the etalon 4 at symmetrically positive and negative angles. Thus, with the same principle as Embodiment 1, the variation of the transmission-wavelength characteristic varying toward frequency regions can be prevented even if an alignment deviation of the etalon 4 exists.

Figure 10:
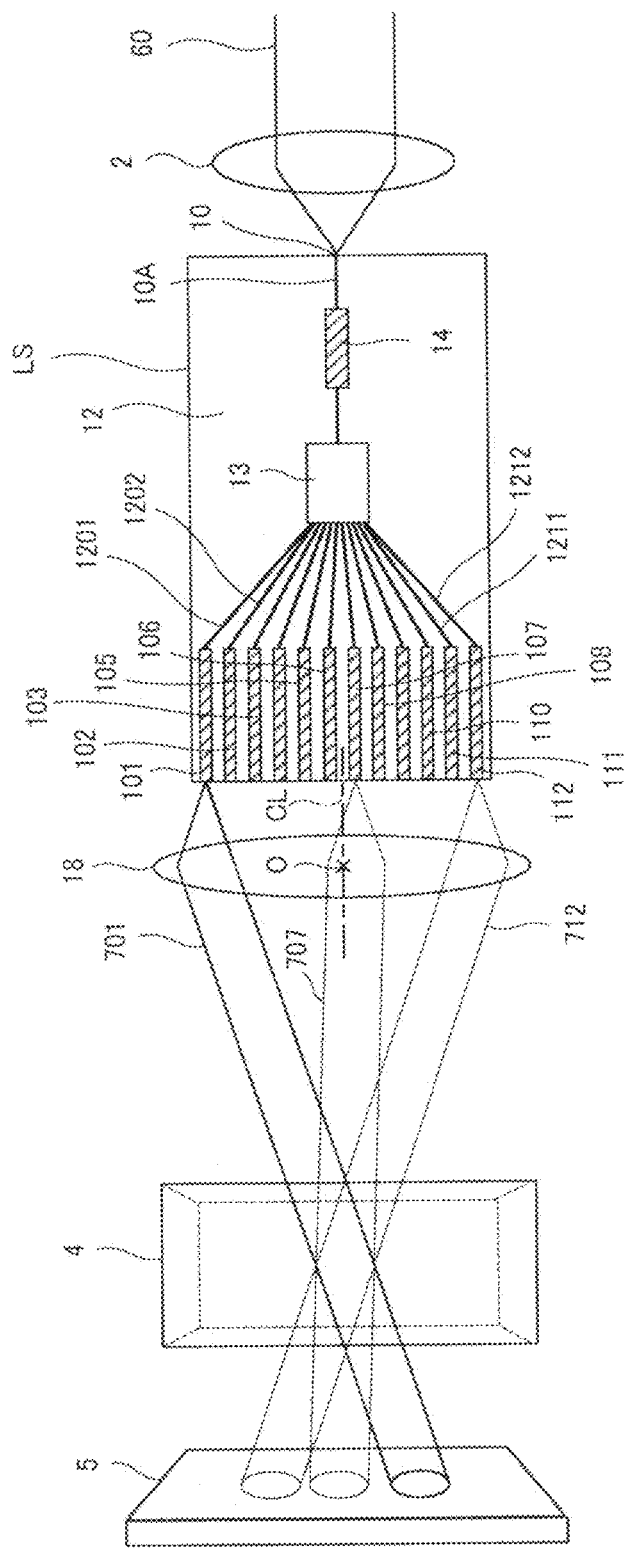
FIG. 10 is a schematic diagram of a conventional wavelength monitor.

Simulation results regarding the transmission-wavelength characteristic of Embodiment 5 is now described. First, for comparison purposes, explanations will be given on the results of simulating the etalon-alignment-angle dependence of the transmission-wavelength characteristic in a conventional structure. FIG. 10 illustrates the structure of a conventional wavelength monitor that is used in the simulation. As shown in FIG. 10, the conventional wavelength monitor does not comprise the optical waveguides 1501-1512, optical multi/demultiplexer 16, and back-side output waveguides 1701-1712 of Embodiment 5. Laser light is emitted backward from the semiconductor lasers 101-112 and transmitted through the etalon 4, and then the intensity thereof is detected by the optical detector 5.

The semiconductor substrate 12 includes thereon the semiconductor lasers 101-112, as shown in Table 1.

TABLE 1

| | Semiconductor laser | | | | | | | | | | | |
|---|---|---|---|---|---|---|---|---|---|---|---|---|
| | 101 | 102 | 103 | 104 | 105 | 106 | 107 | 108 | 109 | 110 | 111 | 112 |
| LD emitting position (μm) | −56.3 | −50.5 | −44.0 | −36.3 | −26.6 | −9.5 | 9.5 | 26.6 | 36.3 | 44.0 | 50.5 | 56.3 |
| Angle of propagation inside the etalon (°) | −4.60 | −4.13 | −3.60 | −2.97 | −2.17 | −0.78 | 0.78 | 2.17 | 2.97 | 3.60 | 4.13 | 4.60 |

The collimating lens 18 as shown in FIG. 10 is disposed such that the center O thereof is on the center line CL between the semiconductor lasers 106 and 107. The collimating lens 18 has a focal length of 0.7 mm, being placed 0.7 mm away from the semiconductor lasers 106 and 107.

The etalon 4 is disposed such that an angle between the normal line of the incident surface thereof and a direction along which the semiconductor lasers 101-112 are arrayed is 90°, and is placed 3.0 mm away from the collimating lens 18. The etalon 4 has a free spectrum range (FSR) of 50 GHz and a refractive index of approximately 1.52.

The optical detector 5 is a photodiode having a receiving surface of 250 μm square. The optical detector 5 is placed 1.0 mm away from the etalon 4 and is disposed such that the normal line of the detecting surface thereof is perpendicular to a direction along which the semiconductor lasers 101-112 are arrayed.

Figure 11:
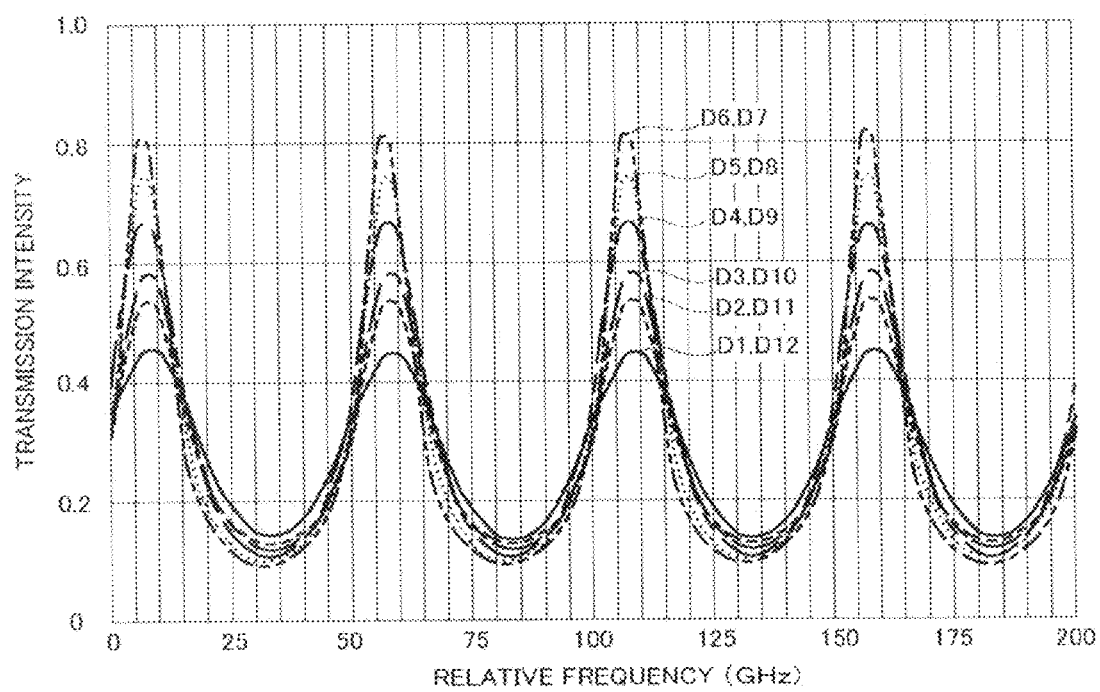
FIG. 11 is a diagram of an etalon transmission characteristic where no etalon-alignment deviation exists in a conventional wavelength monitor.
Figure 12:
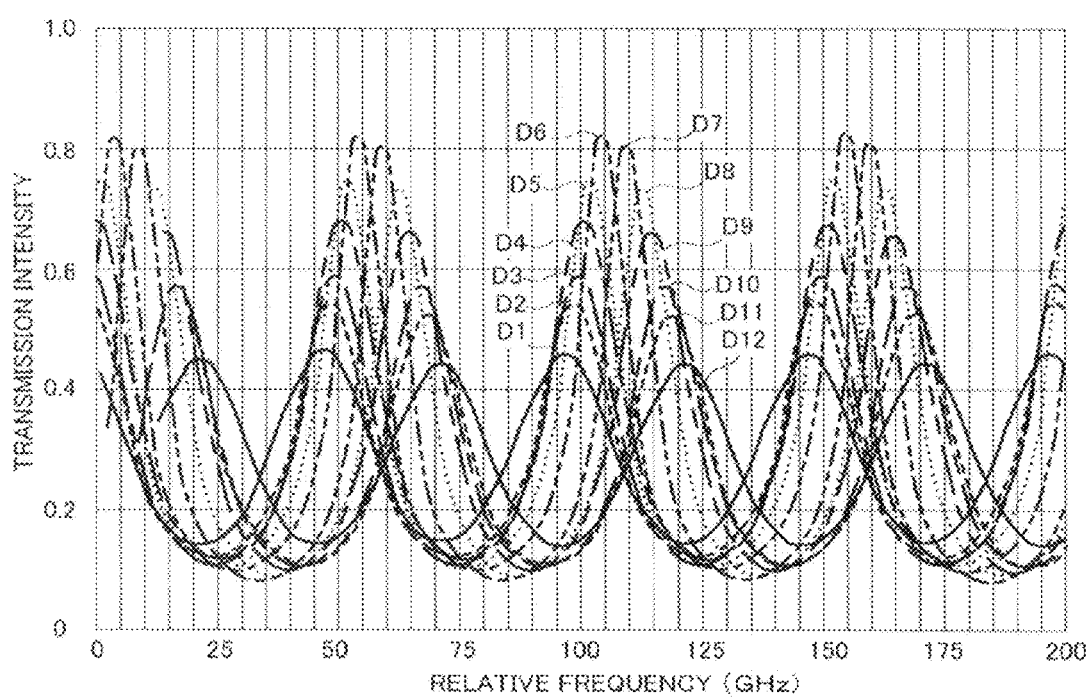
FIG. 12 is a diagram of an etalon transmission characteristic where the etalon angularly deviates by 0.1°.

FIG. 11 illustrates the wavelength-dependence of the intensities of laser beams detected by the optical detector 5 after the light beams are emitted by the semiconductor lasers 101-112 and then transmitted through the etalon 4. The semiconductor lasers 101-112 emit the light beams of different wavelengths. In FIG. 11, graphs regarding the semiconductor lasers 101-112 are represented in an overlapping manner by shifting the lateral axes thereof by an integer multiple of 50 GHz for normalization, where the relative positions with respect to the ITU-T wavelength grid are maintained. The curved lines D1-D12 represent transmission-wavelength characteristics with regard to the semiconductor lasers 101-112, respectively. As shown in FIG. 11, even in conventional structures, if no alignment deviation of the etalon 4 exists, all of the transmission-wavelength characteristics D1-D12 almost coincide on their peak and bottom frequencies. Also, D1-D12 coincide along their slopes between the peaks and bottom frequencies, and the ITU-T wavelength grid is positioned on these slopes. This enables a precise wavelength monitor. On the other hand, FIG. 12 illustrates the transmission-wavelength characteristics in a conventional structure where the angular alignment deviation of the etalon 4 is 0.1°. As shown in FIG. 12, when the angular alignment deviation of the etalon 4 exists in the conventional structure, the curved lines D1-D12 are shifted toward high and low frequency regions with respect to the transmission-wavelength characteristic where the alignment deviation does not exist. This indicates that the wavelength-monitor precision is impaired. In particular, as the semiconductor lasers 101 and 112 are located at the ends of the arrayed the semiconductor lasers, light beams emitted therefrom are incident on the etalon at a greater angle. For this reason, the curved lines D1 and D12, which represent the transmission-wavelength characteristic with regard to these semiconductor lasers 101 and 112, respectively, are shifted toward frequency regions by a greater extent.

Figure 13:
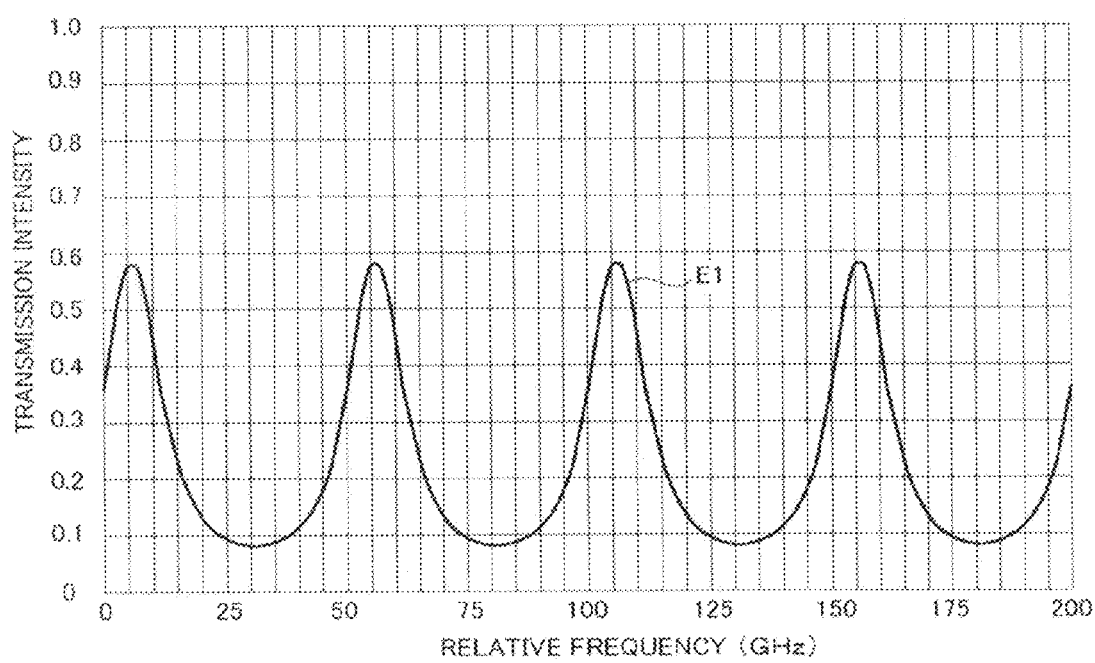
FIG. 13 is a diagram of an etalon transmission characteristic where no etalon-alignment deviation exists in a wavelength monitor according to Embodiment 5 of the present disclosure.
Figure 14:
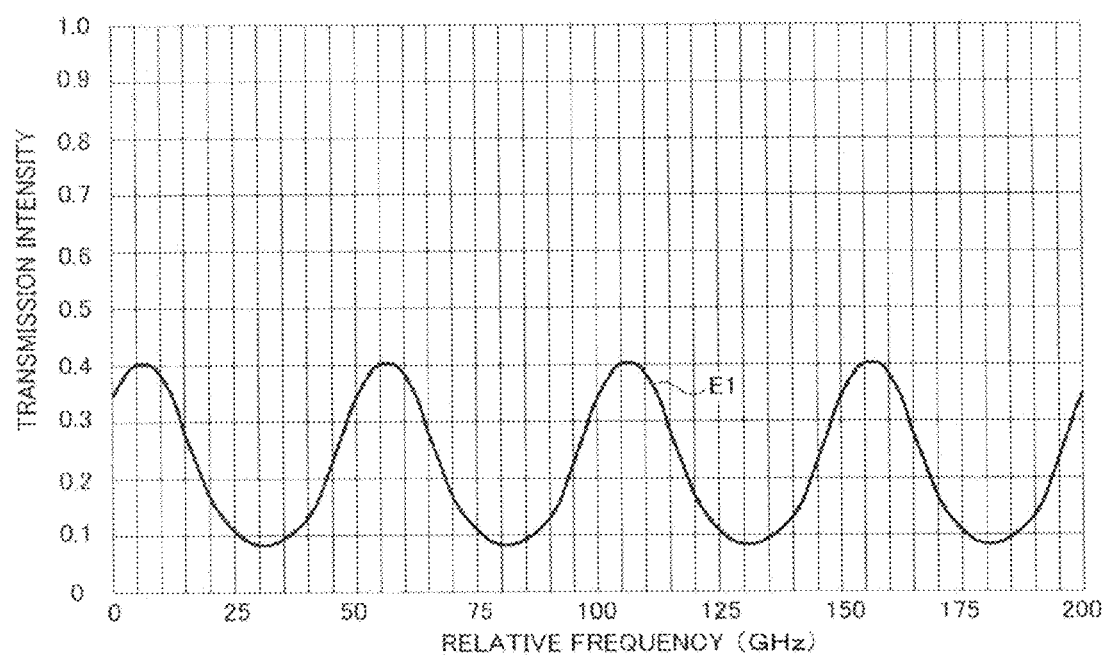
FIG. 14 is a diagram of an etalon transmission characteristic where the etalon angularly deviates by 0.1° in a wavelength monitor according to Embodiment 5 of the present disclosure.

The transmission-wavelength characteristic of Embodiment 5 is now simulated. FIG. 13 illustrates a transmission-wavelength characteristic observed by the optical detector 5 where no angular alignment deviation of the etalon 4 exists. FIG. 14 illustrates the transmission-wavelength characteristic where the angular alignment deviation of the etalon is 0.1°. Conventionally, when one of the semiconductor lasers operates, only a corresponding one of the light beams 701-712 is emitted. In contrast, with the optical multi/demultiplexer 16, even if any of the semiconductor lasers 101-112 operates, all of the beams 701-712 are equally emitted, in Embodiment 5. Thus, in each of FIGS. 13 and 14, there is only one curved line E1 that represents the transmission-wavelength characteristic. E1 of FIG. 13 and E1 of FIG. 14 equal the average of the curved lines D1-D12 of FIGS. 11 and 12, respectively. As shown in FIGS. 13 and 14, it can be understood that, even though a peak intensity of the transmission-wavelength characteristic lowers with the angular alignment deviation of the etalon, variations toward frequency regions are suppressed.

As explained above, the wavelength monitor WM according to Embodiment 5, the light beams 701-706 and respective light beams 707-712 are incident on the etalon at symmetrically positive and negative angles. Thus, with the same principle as Embodiment 1, the variation of the transmission-wavelength characteristic toward frequency regions can be prevented even if an alignment deviation of the etalon 4 exists. That is to say, shifted etalon-transmission characteristics are each offset, so that the etalon-transmission characteristic E1 (sec FIG. 14) can be obtained whose peak frequency is equivalent to that of the etalon-transmission characteristic where no angular alignment deviation of the etalon 4 exists. The optical detector 5 uses the slopes of such etalon-transmission characteristic E1 to detect a light intensity. Accordingly, the required angular precision for alignment of the etalon 4 can be reduced.

The following explains other effects of Embodiment 5. In Embodiment 5 of the present disclosure, of all the propagation angles of the light beams emitted from a plurality of semiconductor lasers 101-112, at least one pair of propagation angles (in this example, all of the six pairs of propagation angles) is symmetrically positive and negative, as shown in Table 1. A pair of symmetric semiconductor lasers is operated to actively adjust the position of the collimating lens 18. More specifically, while the optical detector 5 receives the laser light emitted from the outermost semiconductor lasers 101 and 112, i.e., the back-side output waveguides 1701 and 1712, the collimating lens 18 is reciprocated in a direction along which the semiconductor lasers 101-112 are arrayed, and then a real-time light beam profile is observed so as to adjust the position of the collimating lens 18 such that the center O of the collimating lens 18 is on the center line CL between the back-side output waveguides 1706 and 1707. This facilitates precise adjustment of the collimating lens 18.

Furthermore, as shown in Table 1, light beams emitted from all of the semiconductor lasers 101-112 propagate inside the etalon at ±0.7° or greater, so that returning light that is reflected by the surface of the etalon 4 toward the tunable laser 1 can be approximately −50 dB or less. This suppresses multi-mode oscillation of the tunable laser 1 due to the returning light, thereby stabilizing the operation of the semiconductor lasers 101-112.

Although the present embodiment describes that the twelve semiconductor lasers 101-112 are disposed on the semiconductor substrate 12, the number of semiconductor lasers may be less than twelve, for example, four or eight, or may be greater than twelve.

Embodiment 6

The wavelength monitor WM of Embodiment 6 of the present disclosure is now explained. In the following explanations, common elements shared with Embodiment 5 are marked with the same reference signs.

Figure 15:
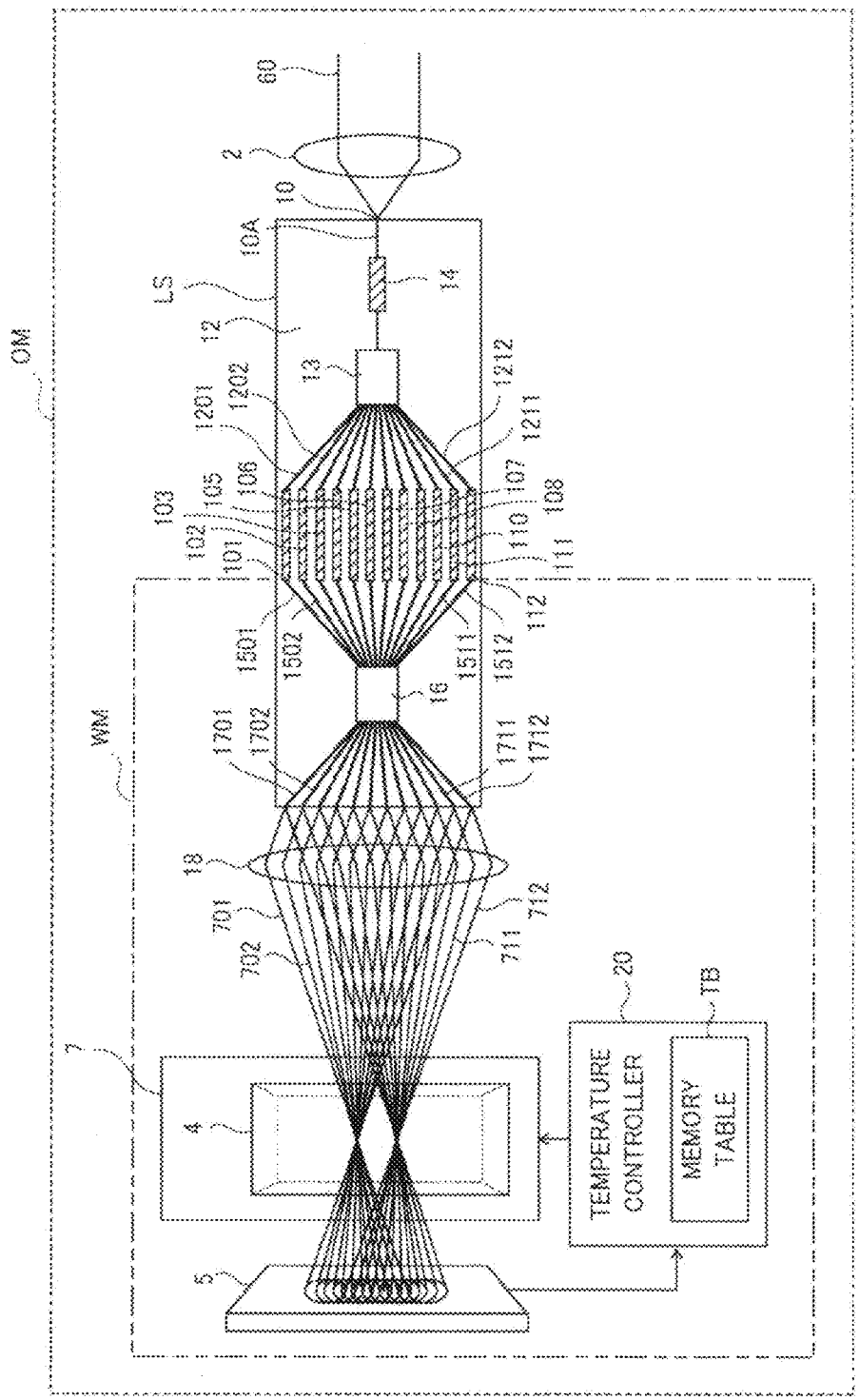
FIG. 15 is a schematic diagram of a wavelength monitor according to Embodiment 6 of the present disclosure.

A wavelength monitor WM according to Embodiment 6, as shown in FIG. 15, comprises a temperature-controllable Peltier device 7 and a temperature controller 20 that control the Peltier device 7. The etalon 4 is provided on the Peltier device 7. The temperature controller 20 controls the Peltier device 7 based on light intensity detected by the optical detector 5, such that the transmission-wavelength characteristic of the etalon 4 coincides with a designed value of the transmission-wavelength characteristic at the oscillating wavelength of the laser source LS.

In manufacturing the wavelength monitor WM of Embodiment 5, the transmission-wavelength characteristic of the wavelength monitor might vary depending on manufacturing precision. Embodiment 6 can prevent the transmission-wavelength characteristic from deteriorating due to the manufacturing variations. The Peltier device 7 adjusts the temperature of the etalon 4 based on a controlling signal received from the temperature controller 20 to thereby match the transmission-wavelength characteristic with a reference transmission-wavelength characteristic, so that the manufacturing variations can be compensated.

Figure 16:
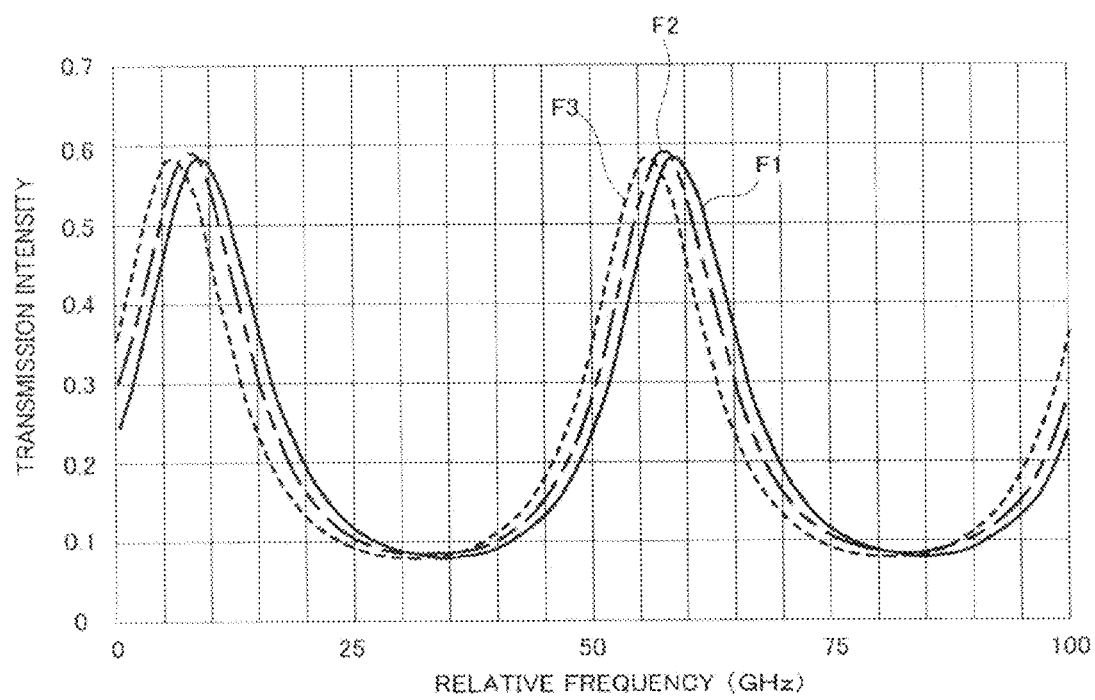
FIG. 16 is a diagram of a transmission-wavelength characteristic where an etalon temperature is 60° C. in a wavelength monitor according to Embodiment 6 of the present disclosure.
Figure 17:
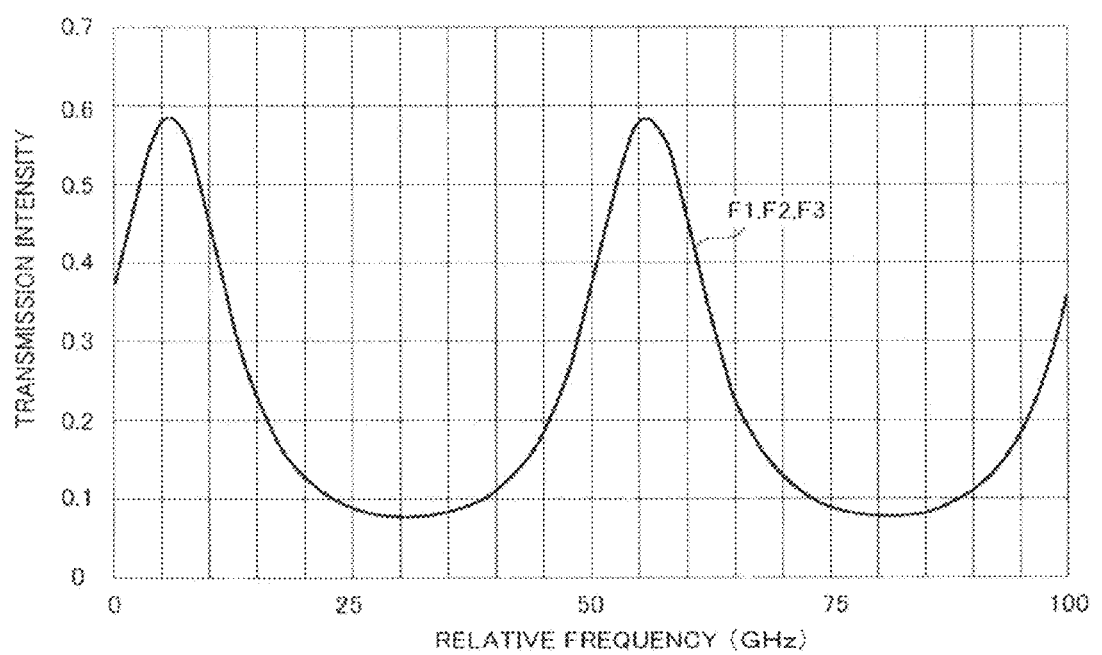
FIG. 17 is a diagram of consistent transmission-wavelength characteristics obtained by adjusting the etalon temperature in a wavelength monitor according to Embodiment 6 of the present disclosure.

The etalon 4 has a FSR that is wavelength-dependent due to the wavelength-dependence of a refractive index. FIG. 16 illustrates simulation results regarding the transmission-wavelength characteristic of Embodiment 5 where the etalon 4 has a temperature of 60° C. and wavelengths are 1.57 μm (curved line F1), 1.59 μm (curved line F2), and 1.61 μm (curved line F3). In FIG. 16, graphs regarding the semiconductor lasers are represented in an overlapping manner by shifting the lateral axes thereof by an integer multiple of 50 GHz for normalization, while the relative positions with respect to the ITU-T wavelength grid are maintained. As shown in FIG. 16, the refractive index of the etalon slightly differs for each wavelength, so that the transmission-wavelength characteristic may vary toward frequency regions. FIG. 17 illustrates simulation results regarding the transmission-wavelength characteristic where the wavelength is 1.57 μm and the etalon temperature is 58° C. (curved line F1), the wavelength is 1.59 μm and the etalon temperature is 60° C. (curved line F2), and the wavelength is 1.61 μm and the etalon temperature is 62° C. (curved line F3). Even in any wavelength-range, consistent transmission-wavelength characteristics can be obtained by adjusting the etalon temperature.

Embodiment 7

A wavelength monitor WM according to Embodiment 7 of the present disclosure is now explained. In the following explanations, common elements shared with Embodiment 5 are marked with the same reference signs.

Figure 18:
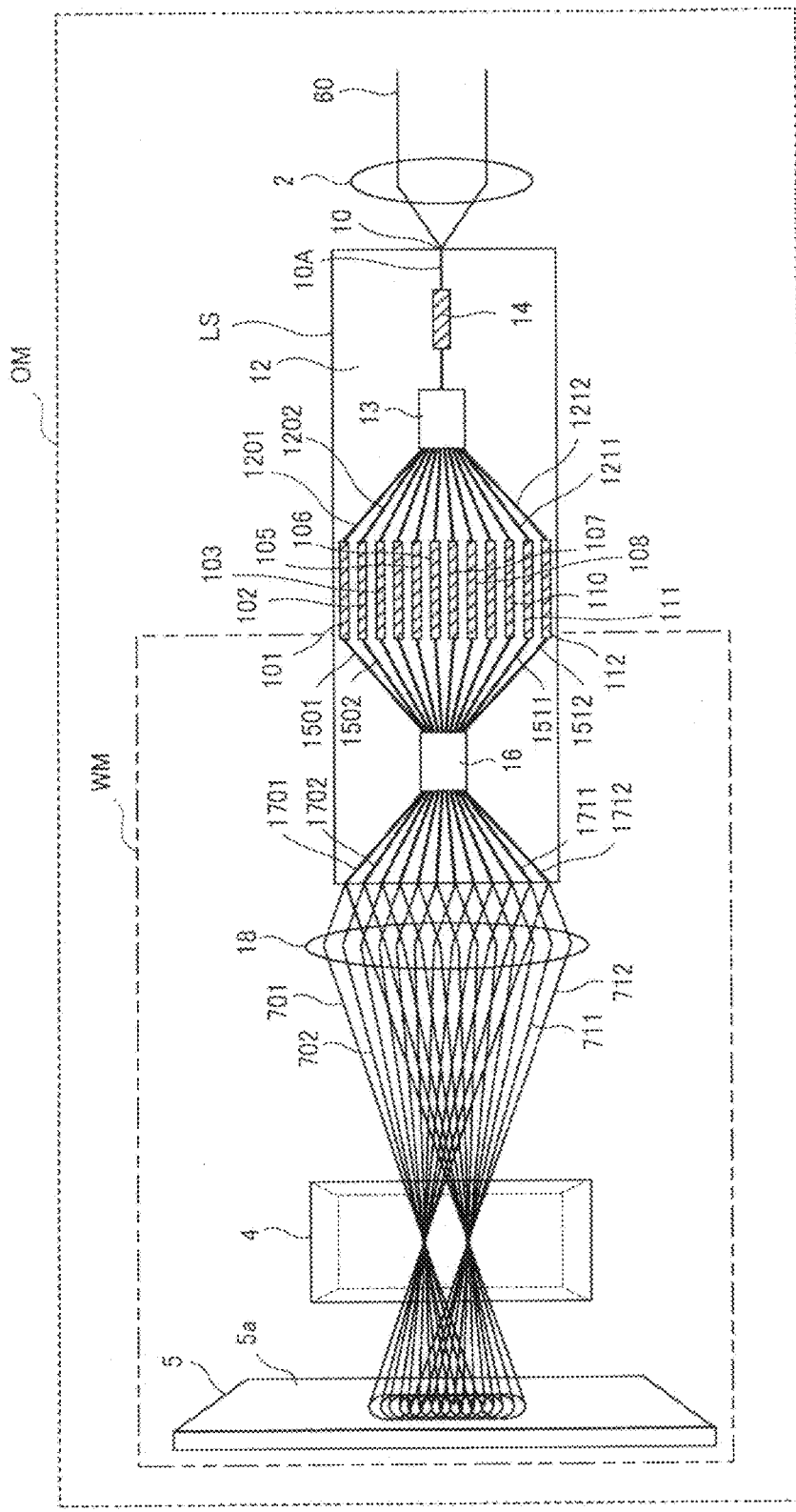
FIG. 18 is a schematic diagram of a wavelength monitor according to Embodiment 7 of the present disclosure.
Figure 19:
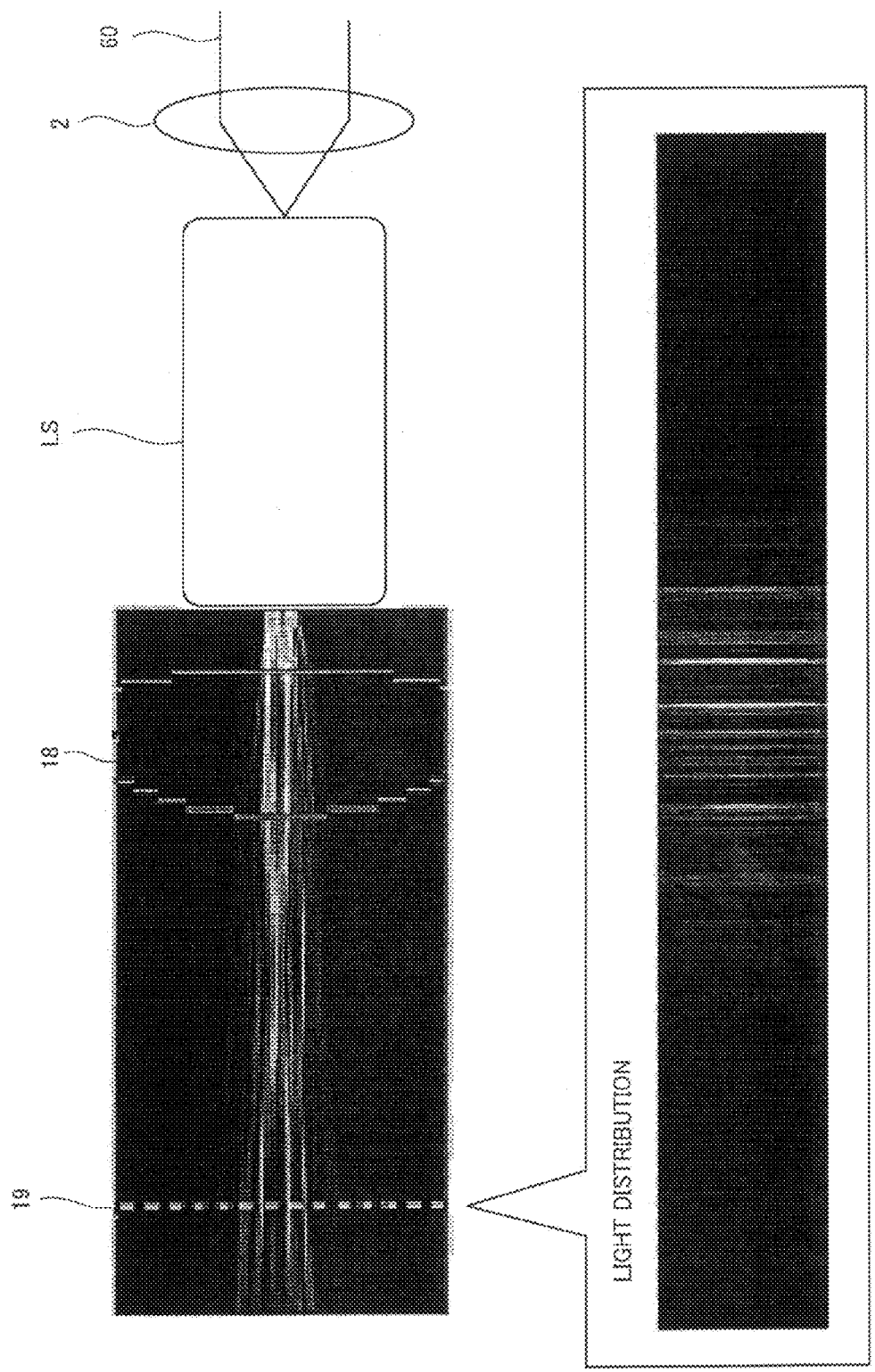
FIG. 19 is a diagram illustrating light interference results on an observing surface.

In the wavelength monitor WM according to Embodiment 7, as shown in FIG. 18, the receiving surface 5a of the optical detector 5 has a rectangular shape that is equivalent to a shape formed by extending the receiving surface 5a of the optical detector 5 of Embodiments 5 and 6 in a direction along which the back-side output waveguides 1701-1712 are aligned. As the number of semiconductor lasers 101-112 on the semiconductor substrate 12 increases, the emitting position of an outer waveguide of the one-dimensionally arrayed back-side output waveguides 1701-1712 are greatly offset from the central axis of the collimating lens 18, thereby the propagation angle of the collimated beam becomes greater. With a rectangular shape, the optical detector 5 can receive the collimated light having the increased propagation angle. FIG. 19 illustrates calculation results regarding the interference of the light beams 701-712 observed on an observing surface 19 that is located approximately 3 mm away from the collimating lens 18. Each of the light beams 701-712 has a randomly-set phase. As shown in FIG. 19, the interference of the twelve light beams 701-712 forms a complicated light distribution. To properly receive the distributed light, the optical detector 5 having the rectangular receiving surface 5a as shown in FIG. 18 is suitable.

As described above, in the wavelength monitor WM according to Embodiment 7 of the present disclosure, the receiving surface 5a of the optical detector 5 is formed in a rectangular shape whose longitudinal direction is a direction along which the semiconductor lasers 101-112 are arrayed. This enables the optical detector 5 to detect the collimated beam that propagates inside the etalon 4 at an increased angle.

The receiving surface 5a of the optical detector 5 may have a shape other than a rectangular shape, such as square, round or rhombus, provided that the laser beams from the semiconductor lasers 101-112 can be received without any omission.

Embodiment 8

The wavelength monitor WM of Embodiment 5 of the present disclosure is now explained. In the following explanations, common elements shared with Embodiment 1 are marked with the same reference signs.

Figure 20:
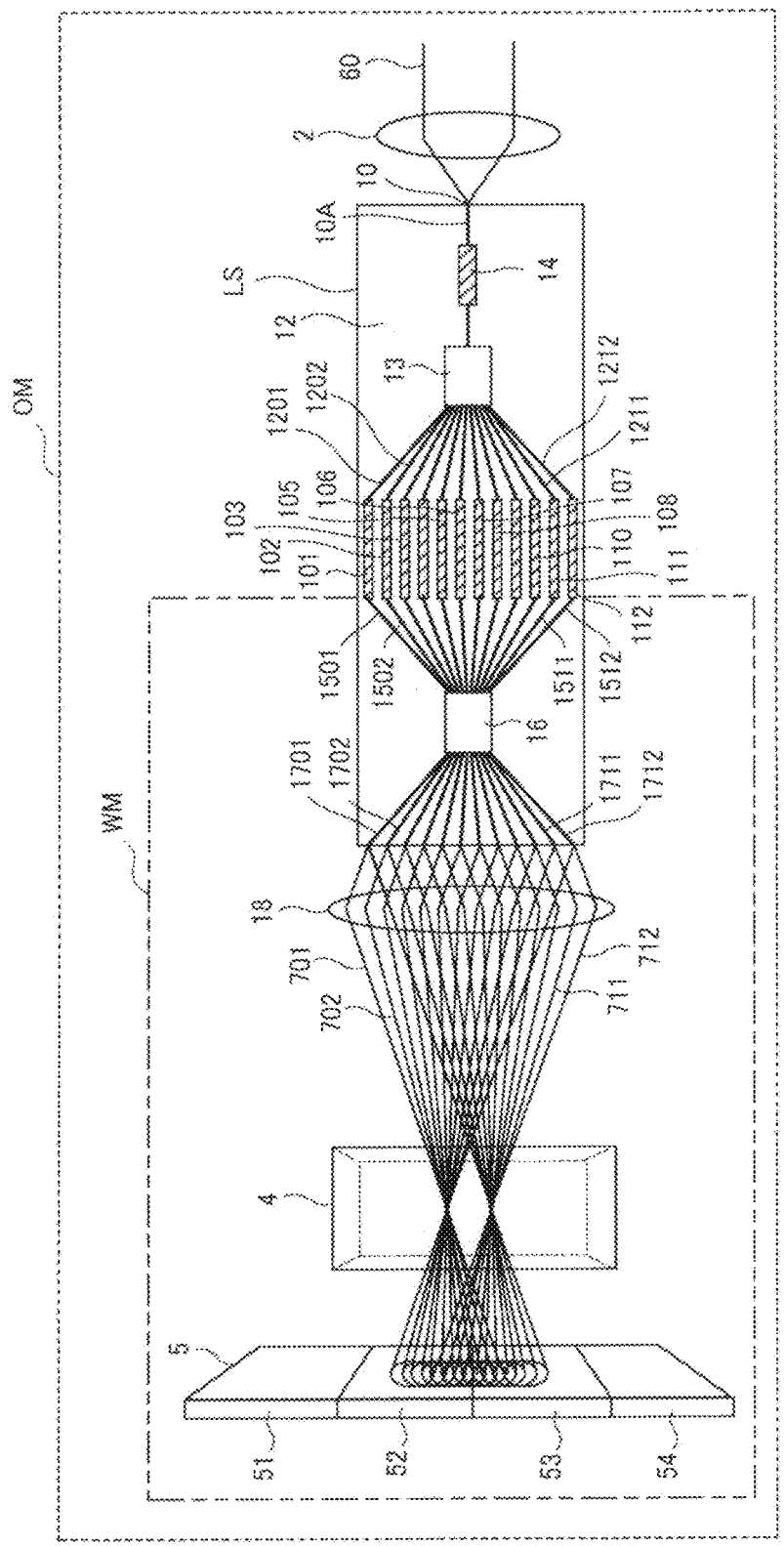
FIG. 20 is a schematic diagram of a wavelength monitor according to Embodiment 8 of the present disclosure.

As shown in FIG. 20, the wavelength monitor WM of Embodiment 8 has a configuration that the optical detector 5 includes four light detecting areas 51-54 that are one-dimensionally arrayed in the direction along which the semiconductor lasers 101-112 are arrayed. An increased number of semiconductor lasers 101-112 on the semiconductor substrate 12 leads to an increase in the eccentricity of an outer waveguide of the arrayed back-side output waveguides 1701-1712 with respect to the central axis of the collimating lens 18, thereby the propagation angle of the collimated beam becomes greater. With the above-described shape, the optical detector 5 can receive the collimated light having an increased propagation angle.

As explained above, in the wavelength monitor WM according to Embodiment 8 of the present disclosure, the optical detector 5 includes the four light detecting areas 51-54 that are arrayed in the same direction as the direction along which the semiconductor lasers 101-112 are arrayed. This enables the optical detector 5 to detect the collimated beams that propagate inside the etalon 4 at increased propagation angles.

Embodiment 8 describes that the optical detector 5 includes four light detecting areas, but this is a non-limiting example. The number of light detecting areas may be set as appropriate depending on the propagation angle of collimated beams.

The present disclosure is not limited to the embodiments described above and may be modified without departing from the spirit of the present disclosure.

Embodiments 5-8 describe that the optical multi/demultiplexer 16 combines and separates the optical waveguides 1501-1512 into twelve back-side output waveguides 1701-1712, the same number as the semiconductor lasers 101-112. Nevertheless, the optical waveguides 1501-1512 may be combined and separated into any even integer that is greater than one and less than the number of semiconductor lasers 101-112, for example, two (one pair), four (two pairs), six (three pairs), eight (four pairs) or ten (five pairs).

In each embodiment as described above, the shape, quantity, numerical values, material, positional relationship, and/or the like, of the tunable laser 1, semiconductor lasers 101-112, collimating lenses 2 and 18, beam splitter 3, optical filer (etalon 4), optical detector 5, and/or the like, are not limited to those as described therein.

Additionally, although the collimating lenses 2 and 18 are described to have a focal length of 0.7 mm in Embodiments 1-4 and 5-8, respectively, the focal length is not limited to 0.7 mm.

Furthermore, although the etalon 4 that is made from crystal is used in the foregoing each embodiment, the etalon 4 may be made from quartz and/or the like or may be an air-gap etalon. In addition, in place of the etalon 4, other forms of filters whose transmittance has a periodic frequency-dependence may be used, such as a resonator disposed on a semiconductor substrate, for example, Si, GaAs, InP, or the like, or on a polymeric substrate or glass substrate.

The receiving surface of the optical detector 5 may not be limited to a 250 μm-square photodiode, and may be greater or less than 250 μm square. The receiving surface may have a shape such as a rectangle, round, or the like.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A wavelength monitor that monitors wavelengths of laser light beams emitted from a laser source and transmitted through a collimating lens, the wavelength monitor comprising:
   an optical filter comprising a transmittance that is periodic with respect to frequencies, the optical filter being disposed such that a pair of same-wavelength collimated beams, emitted through a pair of emitting ports of the laser source and then transmitted through the collimating lens, is incident on the optical filter at symmetrically positive and negative angles; and
   an optical detector that receives the pair of collimated beams transmitted through the optical filter and detects the intensities of the pair of collimated beams.

2. The wavelength monitor according to claim 1, wherein the collimating lens is disposed such that the center of the collimating lens is on a center line between the pair of emitting ports.

3. The wavelength monitor according to claim 1, wherein the intensities of the pair of collimated beams are in a ratio of 1:1 to 1:2.

4. The wavelength monitor according to claim 1, wherein the laser source further comprises:
   a semiconductor substrate;
   a plurality of semiconductor lasers disposed on the semiconductor substrate, the plurality of semiconductor lasers being configured to output respective laser beams with different wavelengths;
   an optical multiplexer/demultiplexer that combines and separates all of the laser beams emitted from the plurality of semiconductor lasers into two output waveguides; and
   two optical amplifiers disposed on the respective two output waveguides.

5. The wavelength monitor according to claim 1, wherein:
   a beam splitter that splits each of the two collimated beams transmitted through the collimating lens into a reflected beam reflected toward the optical filter and a transmitted beam transmitted through the beam splitter;
   a collecting lens that collects two transmitted beams transmitted through the beam splitter; and
   a bifurcating optical fiber including two cores and a bundler that bundles partway the two cores, the two collected beams being respectively incident upon the two cores on an end surface of the bundler.

6. The wavelength monitor according to claim 1, wherein
   a semiconductor substrate;
   a plurality of semiconductor lasers disposed in parallel on the semiconductor substrate, the plurality of semiconductor lasers configured to output respective laser beams with different wavelengths;
   a first optical multi/demultiplexer that combines all of first laser beams, emitted from the plurality of semiconductor lasers, into a first output waveguide; and
   a second optical multi/demultiplexer that combines and separates all of second laser beams, emitted from the plurality of semiconductor lasers toward an opposite direction to the first optical multi/demultiplexer, into second output waveguides, the number of the second output waveguides is an even integer that is greater than one and equal to or less than the number of the semiconductor lasers, wherein
   the collimating lens collimates laser beams emitted through emitting ports of the second output waveguides and is disposed such that the center of the collimating lens is on a centerline between the emitting ports of the second output waveguides, and
   the optical filter is disposed such that the laser beams emitted from the second emitting waveguides propagate inside the optical filter at a propagation angle that is equal to a solution of the following equation (1) and such that a plurality of collimated beams forms pairs of collimated beams all of which are incident on the optical filter at symmetrically positive and negative angles, Equation (1)

$$\theta_k = \arccos\left(\frac{m_k c}{2 n_\lambda L_{etalon} f_k}\right) \quad (1)$$

Equation (2)

$$f_k = f_{MON} + F \quad (2)$$

where $\theta_k$ represents a propagation angle (rad) of a laser beam emitted from the $k^{th}$ semiconductor laser, $m_k$ is an order of interference (any natural number for each k), c represents light speed, $n_\lambda$ represents a refractive index of the optical filter in a wavelength of $\lambda$, $L_{etalon}$ represents a length of the optical filter, and $f_k$ represents a peak frequency at which the transmittance of the optical filter reaches a peak, wherein $f_k$ is obtained by adding the following (i) and (ii) for each k: (i) any frequency $f_{MON}$ of monitoring interest, and (ii) a difference F between the peak frequency and an intermediate frequency at which the transmittance of the optical filter reaches an intermediate between a peak and a bottom.

7. The wavelength monitor according to claim 1, wherein a plurality of collimated beams is incident on the optical filter at an absolute angle of 0.7° or greater.

8. The wavelength monitor according to claim 1, further comprising:
  a temperature adjuster that adjusts a temperature of the optical filter; and
  a temperature controller that controls the temperature adjuster so as to match the transmission-wavelength characteristic of the optical filter with the transmission-wavelength characteristic at an oscillating wavelength of the laser source.

9. The wavelength monitor according to claim 4, wherein the optical detector includes a receiving surface that is formed in a rectangular shape whose longitudinal direction is a direction along which the plurality of semiconductor lasers is arrayed in parallel.

10. The wavelength monitor according to claim 4, wherein
  the optical detector comprises a plurality of light detecting areas, and
  the plurality of light detecting areas is arrayed in a direction along which the plurality of semiconductor lasers is arrayed in parallel.

11. An optical module comprising the wavelength monitor according to claim 1.

* * * * *